(12) United States Patent
Koruga

(10) Patent No.: US 12,405,402 B2
(45) Date of Patent: Sep. 2, 2025

(54) OPTICAL FILTER BASED ON LIGHT-MATTER COUPLING IN QUANTUM-CONFINED CAVITY SPACES

(71) Applicant: Fieldpoint (Cyprus) Limited, Nicosia (CY)

(72) Inventor: Djuro Koruga, Belgrade (RS)

(73) Assignee: Fieldpoint (Cyprus) Limited, Nicosia (CY)

( * ) Notice: Subject to any disclaimer, the term of this patent is extended or adjusted under 35 U.S.C. 154(b) by 753 days.

(21) Appl. No.: 17/595,615

(22) PCT Filed: Jun. 12, 2019

(86) PCT No.: PCT/EP2019/065365
§ 371 (c)(1),
(2) Date: Nov. 19, 2021

(87) PCT Pub. No.: WO2020/249207
PCT Pub. Date: Dec. 17, 2020

(65) Prior Publication Data
US 2022/0260755 A1 Aug. 18, 2022

(51) Int. Cl.
*G02B 1/00* (2006.01)
*G02B 5/20* (2006.01)
(Continued)

(52) U.S. Cl.
CPC .............. *G02B 1/005* (2013.01); *G02B 5/20* (2013.01); *G11C 13/025* (2013.01); *B82Y 20/00* (2013.01); *G02B 2207/101* (2013.01)

(58) Field of Classification Search
CPC .... G02B 1/005; G02B 5/20; G02B 2207/101; G11C 13/025; B82Y 20/00; H01L 2031/0344; C01B 32/156
See application file for complete search history.

(56) References Cited

U.S. PATENT DOCUMENTS

| | | |
|---|---|---|
| 5,640,705 A | 6/1997 | Koruga |
| 2008/0286453 A1* | 11/2008 | Koruga ................. A61K 8/671 351/44 |

(Continued)

FOREIGN PATENT DOCUMENTS

| | | |
|---|---|---|
| CN | 109564307 A | 4/2019 |
| WO | 9604958 A1 | 2/1996 |

(Continued)

OTHER PUBLICATIONS

Office Action issued in Egyptian Patent Application No. PCT 1914/2021, undated.

(Continued)

*Primary Examiner* — Karen Kusumakar
*Assistant Examiner* — Shawn Shaw Muslim
(74) *Attorney, Agent, or Firm* — Barnes & Thornburg LLP

(57) ABSTRACT

An optical filter may comprise a layer structure comprising a plurality of layers stacked in a thickness direction of the layer structure and including: a plurality of nano-photonic layers formed of a nano-photonic material with icosahedral or dodecahedral symmetry and at least one substrate layer formed of an optically transparent material, wherein one of the at least one substrate layer is positioned between two of the plurality nano-photonic layers in the thickness direction of the layer structure.

25 Claims, 26 Drawing Sheets

(51) Int. Cl.
*G11C 13/02* (2006.01)
*B82Y 20/00* (2011.01)

(56) References Cited

U.S. PATENT DOCUMENTS

2014/0225063 A1* 8/2014 Klem ............... H10K 30/10
257/14
2017/0276849 A1* 9/2017 Langner ............... G01J 3/26

FOREIGN PATENT DOCUMENTS

| WO | 9604959 A1 | 2/1996 |
|---|---|---|
| WO | 2016/136722 A1 | 9/2016 |
| WO | 2017211420 A1 | 12/2017 |

OTHER PUBLICATIONS

Office Action issued by the Indian Patent Office dated Mar. 28, 2022, application No. 202217000853.
Office Action issued by the Eurasian Patent Organization dated Aug. 16, 2022, application No. 202193106.
Office Action dated Nov. 8, 2022, issued by the Japanese Patent Office for Patent Application No. 2021-569920. English translation included.
Wang et al. "Recent advances on optical vortex generation", Nanophotonics 2018: 7(9), 1533-1556. English translation included.
Auffeves, A., et al., "Strong Light-Matter Coupling, From Atoms to Solid-State Systems, Exciton-Polaritons in Bulk Semiconductors and in Confined Electron and Photon Systems", World Scientific, Chapter 2, 47 pages.
Carusotto, I., "Quantum fluids of light", arXiv:1205.6500v3, [cond-mat.quant-gas], Oct. 17, 2012, 76 pages.
Castelletto, S., et al., "A silicon carbide room-temperature single-photon source", Nature Materials, Letters, Published Online: Nov. 17, 2013, pp. 1-6.
Dal Negro, L., "Light Transport through the Band-Edge States of Fibonacci Quasicrystals", Physical Review Letters, vol. 90, No. 5, week ending Feb. 7, 2003, pp. 1-4.
Kavokin, A., et al., "Microcavities", Second Edition, Oxford Science Publications, pp. 208-217.
Lounis, B., et al., "Single photons on demand from a single molecule at room temperature", Letters to Nature, vol. 407, Sep. 28, 2000, pp. 491-493.

Koruga, D., "Hyperpolarized Light, Fundamentals of Nanobiomedical Photonics", Zepter Book World, 2018, pp. 19-22, 33-39, 43-47, 159-166.
Michler, P., et al., "Quantum correlation among photons from a single quantum dot at room temperature", Letters to Nature, vol. 406, Aug. 31, 2000, pp. 968-970.
Moradi, A., "Electromagnetic wave propagation in a random distribution of C60 molecules", Physics of Plasmas, (1994-present), 21, 4 pages.
Merino, P., et al., "Exciton dynamics of C60-based single-photon emitters explored by Hanbury Brown-Twiss scanning tunnelling microscopy", Nature Communications, Published Sep. 29, 2015, pp. 1-6.
Zhao, G. L., et al., "Electronic structure of C60 semiconductors under controlled doping with B, N, and Co atoms", Science Direct, Diamond and Related Materials, 7 (2008), pp. 749-752.
Rotkin, V. V., et al., "Calculation of the Polariton Effect in the Fullerene Monolayer", Fullerenes, Recent Advances in the Chemistry and Physics of Fullerenes and Related Materials, vol. IV, PV 97-14, pp. 943-955 (Apr. 25, 1997).
Lof, R. W., et al., "Band Gap, Excitons, and Coulomb Interaction in Solid C60", Physical Review Letters, vol. 68, No. 26, Jun. 29, 1992, pp. 3924-3927.
Dresselhaus, M. S., et al., "Science of Fullerenes and Carbon Nanotubes", Academic Press, 2 pages.
Basche, TH., et al., "Photon Antibunching in the Fluorescence of a Single Dye Molecule Trapped in a Solid", Physical Review Letters, vol. 69, No. 10, Sep. 7, 1992, pp. 1516-1519.
Kuhnke, K., et al., "C60 Exciton Quenching near Metal Surfaces", Physical Review Letters, vol. 79, No. 17, Oct. 27, 1997, pp. 3246-3249.
Long, J. P., et al., "Photoelectron spectroscopy and dynamics of excitons in C60 and photopolymerized C60 films", Chemical Physics Letters, 347 (2001), pp. 29-35.
Kuhnke, K., et al., "Versatile optical access to the tunnel gap in a low-temperature scanning tunneling miscroscope", AIP, Review of Scientific Instruments, 81, 113102 (2010), 8 pages.
Wang, T., et al., "Excitation of propagating surface plasmons with a scanning tunnelling microscope", Nanotechnology 22 (2011) 175201, 6 pages.
Office Action issued by the Brazilian Patent Office for Application No. BR112021025135-9, dated Mar. 20, 2024.
Office Action issued by the Egyptian Patent Office for Application No. PCT 1914/2021, dated Oct. 27, 2024. For informational purposes only.

* cited by examiner

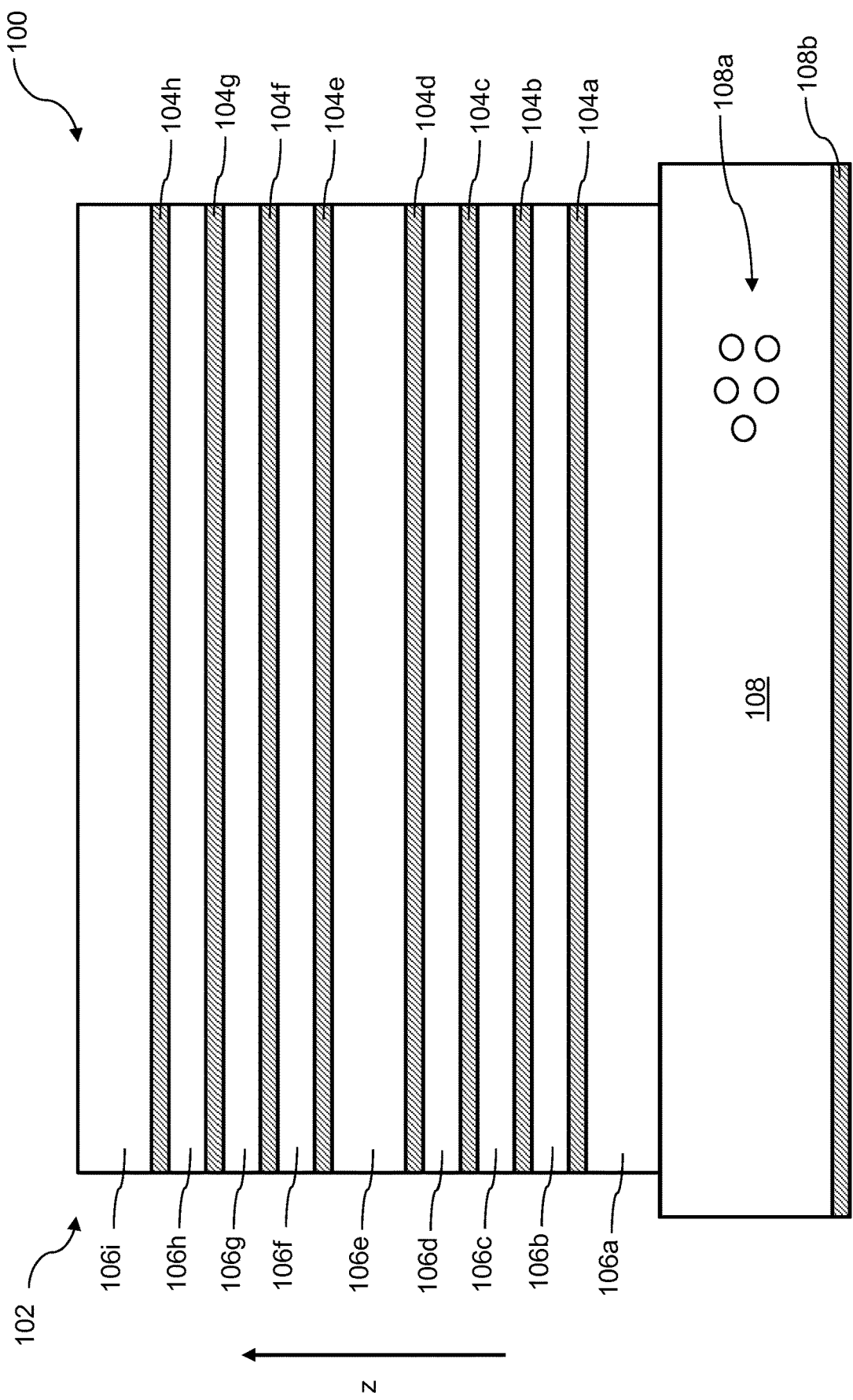

| Light Source | $E_v$ (lux) | $T_{cp}$ (lux) | $\lambda_d$ (nm) | CIE 1931 | $P_e$ (%) | SDE (W/m²) 380-780 nm | SDE (W/m²) 400-500 nm | SDE (W/m²) 500-600 nm | SDE (W/m²) 600-700 nm |
|---|---|---|---|---|---|---|---|---|---|
| 1 | 2 | 3 | 4 | 5 | 6 | 7 | 8 | 9 | 10 |
| A0 LED light | 2440.1 | 8285 | 476 | x=0.29 y=0.26 | 16.6 | 8.30 1.00 | 3.22 | 3.56 | 1.50 |
| A01 LED/PMMA | 2380.4 | 7248 | 481 | x=0.30 y=0.31 | 12.0 | 7.82 0.94 | 2.74 | 3.40 | 1.45 |
| A011 LED/PMMA C60 (@) | 1201.1 | 4333 | 574 | x=0.37 y=0.30 | 27.4 | 3.42 0.41 | 0.71 | 1.73 | 0.94 |
| A02 LED/CR39 | 2395.3 | 7387 | 480 | x=0.30 y=0.30 | 12.7 | 7.95 0.96 | 2.78 | 3.46 | 1.38 |
| A021 LED/CR39 C60 (nf) | 949.9 | 3618 | 575 | x=0.42 y=0.45 | 61.8 | 2.55 0.30 | 0.26 | 1.37 | 0.85 |
| B0 NEON light | 444.2 | 5842 | 529 | x=0.32 y=0.35 | 4.7 | 1.38 1.00 | 0.49 | 0.65 | 0.24 |
| B01 NEON/PMMA | 434.6 | 5818 | 530 | x=0.32 y=0.35 | 4.8 | 1.34 0.97 | 0.48 | 0.64 | 0.24 |
| B011 NEON/PMMA C60 (@) | 259.4 | 3956 | 573 | x=0.39 y=0.43 | 49.2 | 0.70 0.50 | 0.13 | 0.37 | 0.19 |
| B02 NEON/CR39 | 431.4 | 5830 | 532 | x=0.31 y=0.34 | 5.4 | 1.32 0.98 | 0.47 | 0.63 | 0.22 |
| B021 NEON/CR39 C60 (nf) | 145.3 | 3539 | 575 | x=0.43 y=0.47 | 72.2 | 0.38 0.27 | 0.04 | 0.20 | 0.12 |

FIG. 25

OPTICAL FILTER BASED ON LIGHT-MATTER COUPLING IN QUANTUM-CONFINED CAVITY SPACES

TECHNICAL FIELD

Various embodiments relate generally to optical filters as well as to spectacles and hyperlight devices including optical filters. Further embodiments relate to optical lenses, room lighting means, street lighting means, laptop foils, mobile phones, vehicle glazing (cars and trucks), aircraft glazing, windows in general such as building windows, and toys, respectively including optical filters.

BACKGROUND

Light therapy has gained significant importance in the past few years, in particular in the therapy of—but not limited to—skin diseases. In this field, it is generally recognized that the therapeutic effect is closely related to the characteristics of the light used for therapy including not only the wavelength range of the light but also characteristics related to the spatial distribution of the photons depending on, e.g. the angular momentum. The influence on the therapeutic effect of these characteristics has become the subject of intense research in the past years. Examples of developments in this field are disclosed inter alia in US 2008/286453 A1 and WO 2017/211420 A1.

Further aspects related to the present disclosure can be found in: U.S. Pat. No. 5,640,705; Andreani, C. L, "Exciton-Polaritons in Bulk Semiconductors and in Confined Electron and Photon Systems", p. 37-82, 2014 in book Eds. Auffeves. A et al, "Strong Light-matter coupling: From atoms to solid-state systems", Word Scientific, ISBN 978-981-4460-34-7; Carusotto, I. and Ciuti, C., "Quantum fluids of light", arXiv:1205.6500v3, 17 Oct. 2012; Castelletto, S, at al.: "A silicon carbide room temperature single-photon source", Nature Materials, 13, 151-156, 2014; Del Negro, et. al. "Light transport trough the band—edge states of Fibonacci quasicrystals, Physical Review Letters, 90 (5):055501-1-4, 2003; Kavokin, A. V. et al., "Microcavities", Oxford University Press, Oxford, 2017; Lounis, B., and Moerner, W. E. "Single potons on demand from a single molecule at room temperature", *Nature,* 407: 491-493, 2000; Koruga, D j., "Hyperpolarized light": Fundamentals of nanobiomedical photonics", Zepter Book World, Belgrade 2018; Michler, P., et al., "Quantum correlation among photons from a single quantum dot at room temperature", *Nature,* 406: 968-970, 2000; Moradi A., "Electromagnetic wave propagation in a random distribution of $C_{60}$ molecules", *Physics of Plasmas* 21, 104508, 2014; WO 9604958 A1; and WO 9604959 A1.

The efficient conversion of light emitted by conventional light sources employed for light therapy into light with predetermined characteristics such as a predetermined spatial distribution of the photons depending on their angular momenta is of huge importance for a highly efficient light therapy.

SUMMARY

According to the present invention, an optical filter is provided. The optical filter may include a layer structure comprising a plurality of layers stacked in a thickness direction of the layer structure and including: a plurality of nano-photonic layers formed of a nano-photonic material with icosahedral or dodecahedral symmetry, and at least one substrate layer formed of an optically transparent material, wherein the at least one substrate layer is positioned between two of the plurality nano-photonic layers in the thickness direction of the layer structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention will be described with reference to the following drawings, in which:

FIG. 8 is a schematic drawing illustrating an optical filter according to yet another exemplary embodiment of the present disclosure;

FIG. 25 is a table summarizing results of measurements carried out with optical filters according to the present disclosure.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Intense research during the past years has revealed that the therapeutic effect of light therapy can be significantly increased by using light, the photons of which are spatially ordered by angular momentum. This kind of light will be referred to as "hyperlight" in the subsequent description. The characteristics of hyperlight will be briefly described in the following with reference to FIG. 1.

Figure 1:
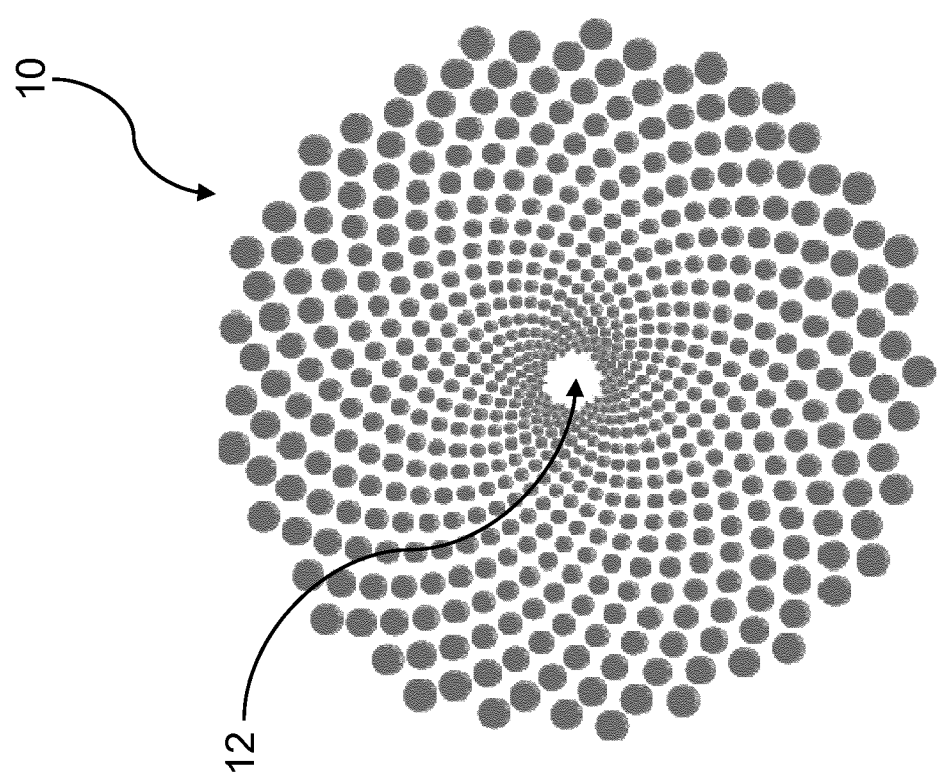
FIG. 1 is a schematic drawing illustrating the main characteristics of hyperlight.

FIG. 1 schematically illustrates the characteristics of hyperlight 10. In FIG. 1, photons emanate from a central point 12 and are ordered by angular momentum along respective spirals.

The spiral pattern of photons with different angular momenta is similar to a sunflower seed pattern. The seeds in a sunflower are arranged in spirals, one set of spirals being left handed and one set of spirals being right handed. The ratio of the number of right-handed spirals to the number of left-handed spirals is given by the golden ratio $\Phi=(1+\sqrt{5})/2 \approx 1.62$.

The number of right-handed spirals and left-handed spirals associated with angular momenta in the hyperlight shown in FIG. 1 is also determined by the golden ratio. In detail, in FIG. 1, 21 left-handed and 34 right-handed spirals can be identified, the ratio of which is given by the golden ratio $\Phi$.

Hyperlight can be generated by resonant emission of the energy eigenstates $T_{1g}$, $T_{2g}$, $T_{1u}$, and $T_{2u}$ of $C_{60}$. This, however, means that there are some restrictions in view of the energy of incident light.

The present disclosure proposes an alternative way of generating hyperlight which is based on polaritons, i.e. photon-exciton pairs, in a cavity formed by nano-photonic material with icosahedral or dodecahedral symmetry. This will be explained in detail in the following starting with a brief discussion of the characteristics of nano-photonic material with icosahedral or dodecahedral symmetry.

As an example of such a nano-photonic material with icosahedral symmetry $C_{60}$ fullerenes will be exemplarily discussed. $C_{60}$ is composed of 60 carbon atoms ordered in 12 pentagons and 20 hexagons. $C_{60}$ has two bond lengths. A first bond length is defined by the length of an edge between two adjacent hexagons and the second bond length is defined by the length of an edge between a hexagon and an adjacent pentagon, the first bond length being greater than the second bond length. $C_{60}$ molecules have a diameter of about 1 nm and rotate in a solid about 1.8 to $3 \cdot 10^{10}$ times per second around one of 31 axes of rotation which can be characterized in terms of their symmetry. In detail, in $C_{60}$ a total of 6 axes of rotation $C_5$ with a 5-fold symmetry, a total of 10 axes of rotation $C_3$ with a 3-fold symmetry, and a total of 15 axes of rotation $C_2$ with a 2-fold symmetry can be identified. A $C_{60}$ molecule rotates alternately and randomly around these axes of rotation.

Figure 2:
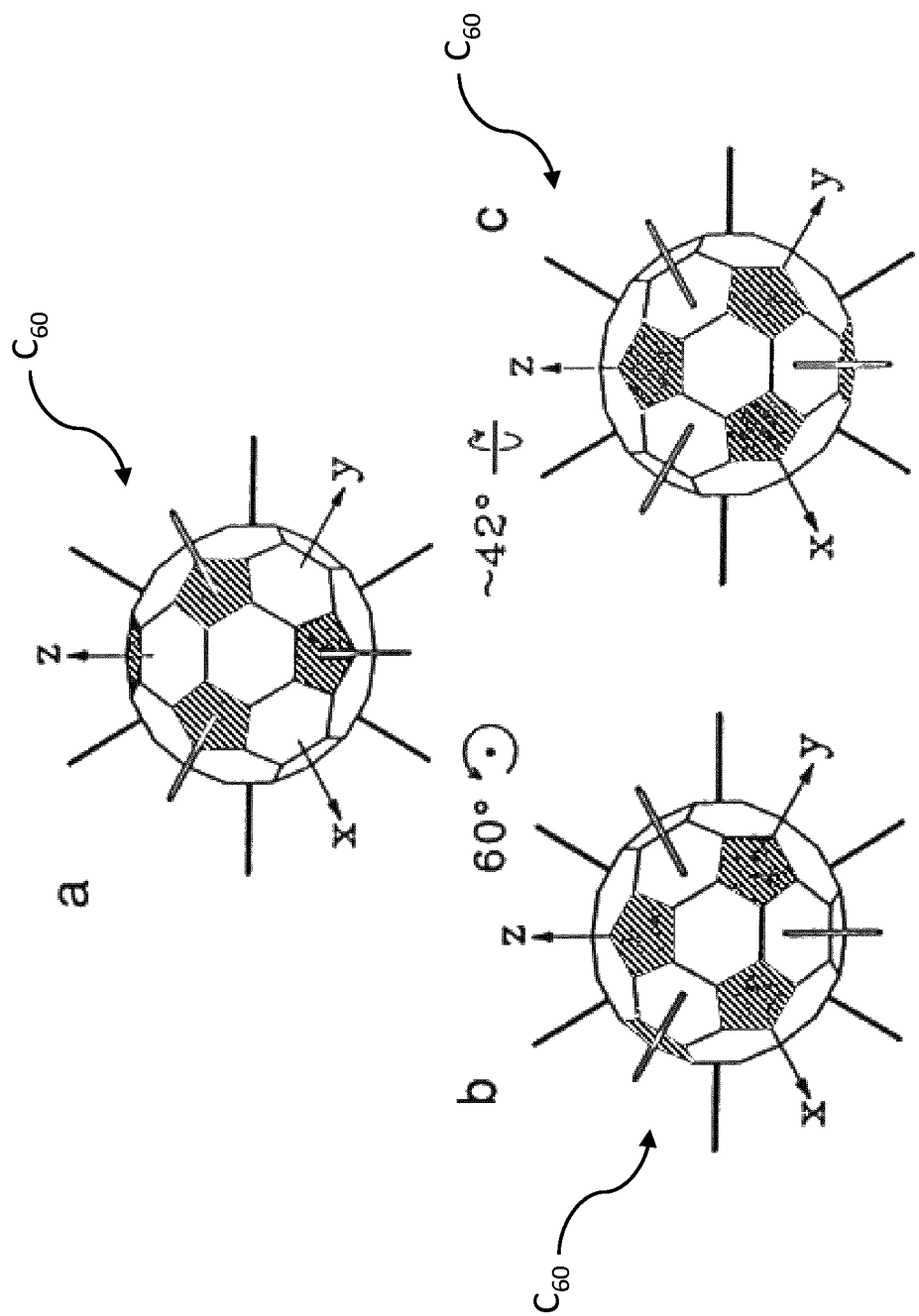
FIG. 2 shows three rotational states of a $C_{60}$ molecule.

In FIG. 2 three possible orientations of a $C_{60}$ molecule with respect to a fixed set of axes C5, C3, and C2 is shown. The plane of each drawing is orthogonal to a [111] direction. The thin rods represent [110] directions that are orthogonal to the [111] direction. The transformation from state "a" to state "b" in FIG. 2 involves a 60° rotation about the [111] direction, while a transformation from state "a" to state "c" in FIG. 2 involves a ~42° rotation about the [110] direction.

Incident photons may interact with a $C_{60}$ molecule in different ways: (a) with the outer surface of the molecule and (b) with the inner surface of the molecules. The interaction probability of incident photons passing through the pentagons with the inner surface is zero. Therefore, the areas of the pentagons can be considered to be "closed" for this specific interaction.

The probability of an interaction of photons passing through the hexagons with the inner surface is larger than zero. However, this specific interaction probability depends on the dynamic state of a particular $C_{60}$ molecule determined inter alia by the previously described random rotation of the respective $C_{60}$ molecules around the above-mentioned axes of rotation, meaning that the interaction probability changes with time. This probability can be expressed in terms of effective areas of the hexagons which are exemplarily shown in FIG. 3.

Figure 3:
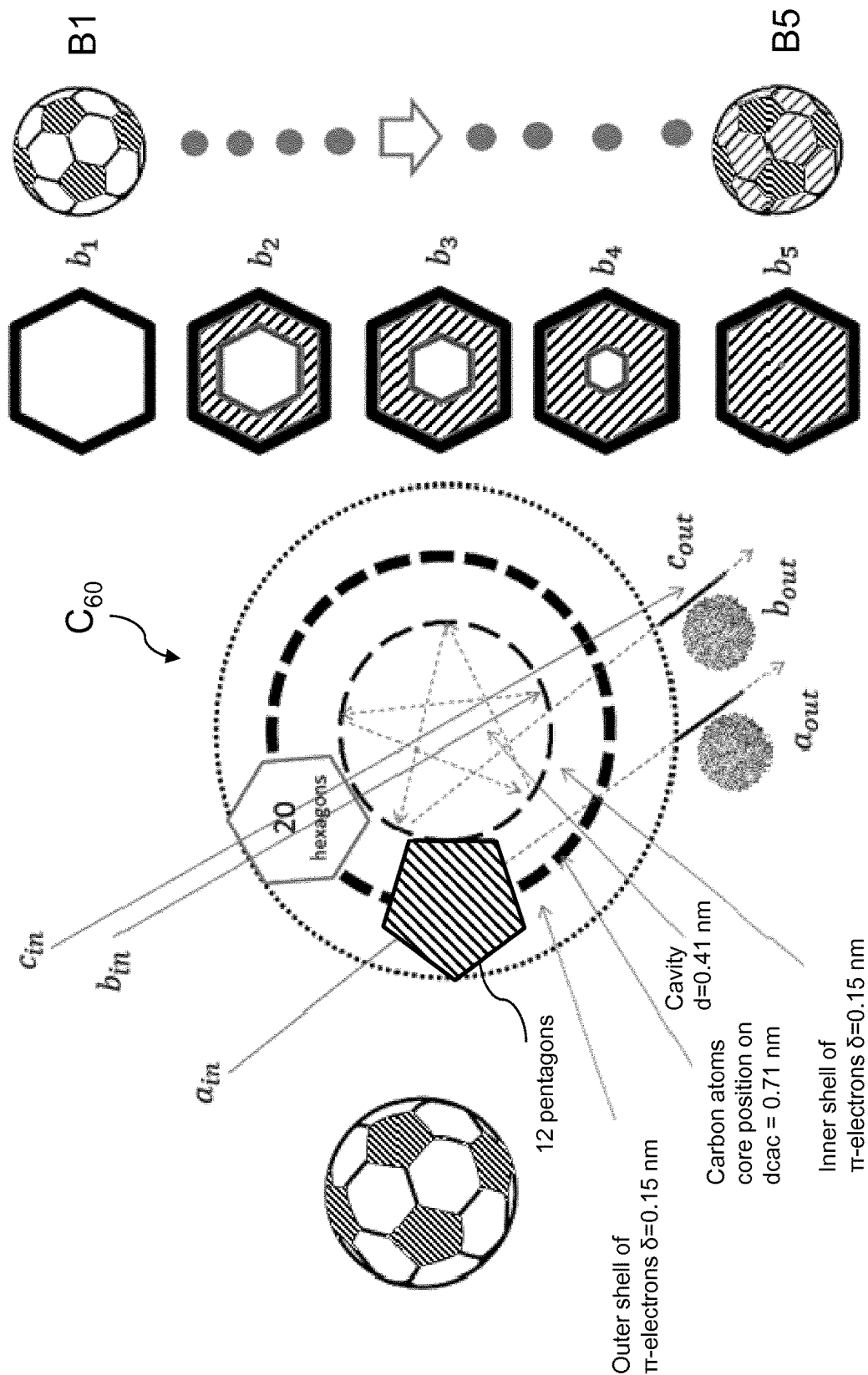
FIG. 3 schematically illustrates different interaction mechanisms of light with a $C_{60}$ molecule as a 0D cavity.

In FIG. 3, a $C_{60}$ molecule is schematically shown. Among the 12 pentagons only one is exemplarily shown. The representative pentagon is hatched in FIG. 3 which hatching indicates that an incident photon $a_{in}$ passing through a pentagon does not interact with the inner surface of the $C_{60}$ molecule, i.e. it does not interact with the cavity defined within the molecule. In FIG. 3, $a_{out}$ denotes such a photon that has passed through the $C_{60}$ molecule.

Similarly, among the 20 hexagons only one is shown in FIG. 3. Due to the above-described dynamics of a $C_{60}$ molecule, a hexagon may have different effective areas, meaning that depending on a specific vibrational and/or rotational state of a $C_{60}$ molecule, the probability of interaction of a photon with the inner surface of a $C_{60}$ molecule after having passed through a hexagon is different. The different states of a hexagon are indicated in FIG. 3 by means of the different hatchings. In detail, one hexagon is shown in five different states $b_1$-$b_5$, wherein in the state $b_1$ the hexagon is shown to be fully open indicating the highest interaction probability of an incident photon passing through this hexagon with the inner surface of the $C_{60}$ molecule, whereas in the state $b_5$ the area of the hexagon is shown to be fully closed indicating a corresponding interaction probability of zero. The states $b_2$, $b_3$, and $b_4$ are intermediate states corresponding to interaction probabilities between zero and the highest probability associated with the state $b_1$.

In addition, in FIG. 3, B1 shows a state of the entire molecule in which all hexagons are in the state $b_1$. As mentioned above, the pentagons are always fully closed. Therefore, the pentagons are depicted as entirely hatched areas.

B5 shows a state of the entire molecule in which all hexagons are in the state $b_5$. Therefore, both the pentagons and the hexagons are depicted as entirely hatched areas, meaning that in this state of the molecule no incident photon will interact with the cavity inside of the molecule.

In FIG. 3, $b_{in}$ denotes a photon passing through a hexagon, i.e. entering the cavity inside of a $C_{60}$ molecule, and interacting with the inner surface thereof, i.e. with the cavity. A photon leaving the $C_{60}$ molecule after such an interaction is denoted by $b_{out}$. As further indicated by $c_{in}$ and $c_{out}$, there are also photons that pass through hexagons, i.e. which enter the cavity, without interacting with the cavity.

In FIG. 3 the respective dimensions of the cavity as well as of the inner and outer shells of the $\pi$ electrons, and the carbon atom core positions are also shown.

The 12 pentagons make up about 38% of the entire surface of a $C_{60}$ molecule. The 20 hexagons make up about 62% of the surface of a $C_{60}$ molecule. As previously mentioned, the effective areas of the hexagons change due the above-discussed dynamic behavior of the respective $C_{60}$ molecules. Therefore, the effective probability of an interaction of an incident photon with the inner surface of a $C_{60}$ molecule is lower.

An incident photon interacting with the inner surface of a $C_{60}$ molecule may generate a bound electron-hole pair, i.e. an exciton, or may couple to an existing exciton to form a polariton. Decaying excitons may also emit a photon (radiative recombination) which can also couple to another existing exciton to form a polariton. Calculations have revealed that the probability for the generation of an exciton is about 38%, whereas the probability of forming a polariton is lower. Calculations and experiments with different sources of light have revealed probabilities for the generation of a polariton in the range of about 15-25%.

By means of the interaction of incident photons with the cavities formed in the $C_{60}$ molecules to thereby form polaritons, the spectral characteristics of the light is changed and the spatial distribution of the photons depending on their angular momenta is converted into the configuration shown in FIG. 1, meaning that hyperlight is generated in this way.

Figure 4A:
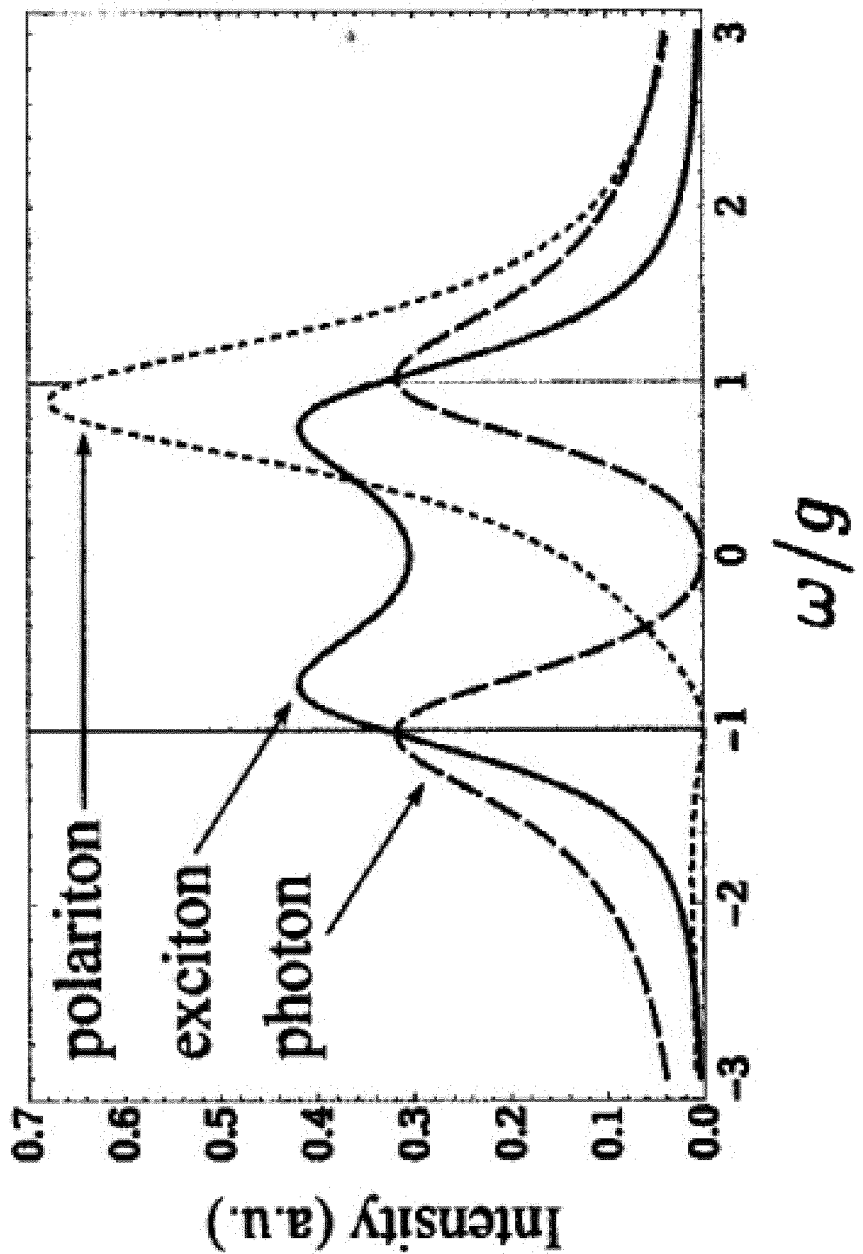
FIG. 4a is a graph showing the power spectra of a photon, of an exciton, and of a polariton as a function of an effective coupling strength.
Figure 4B:
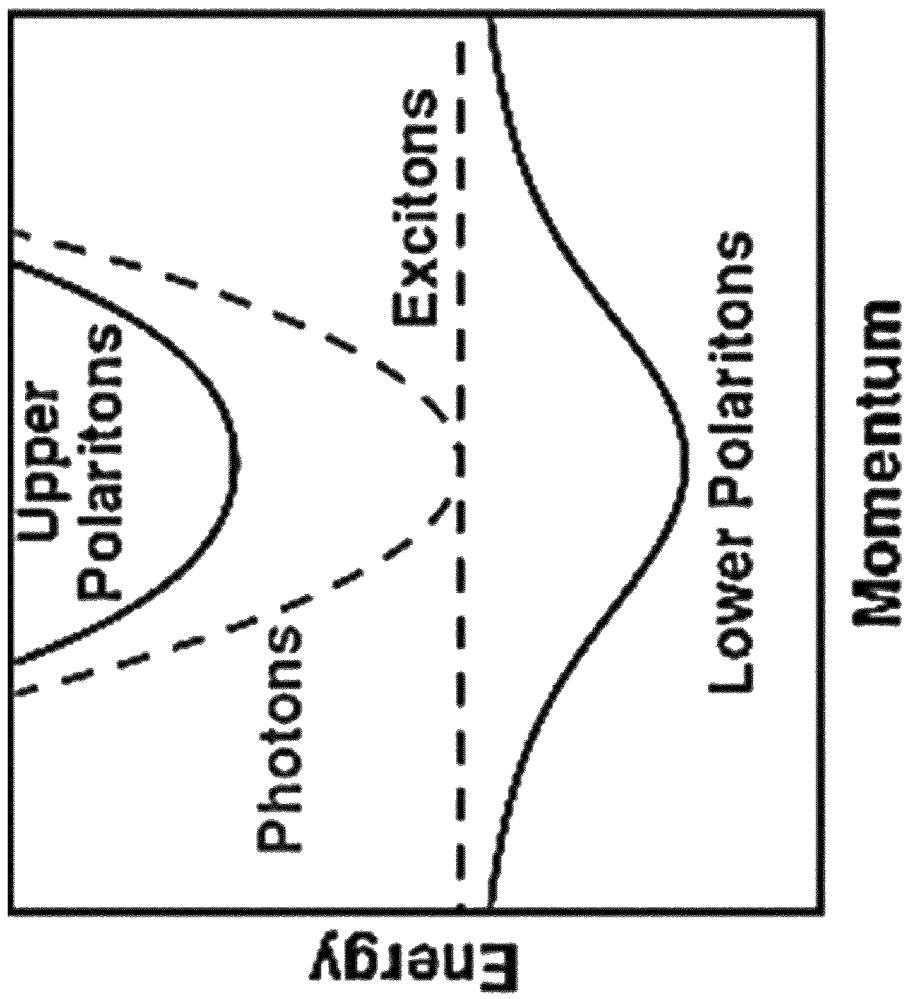
FIG. 4b is a graph showing the power spectra of a photon, of an exciton, and of polaritons as a function of momentum.

The power spectra of a photon, an exciton, and a polariton as a function of an effective coupling strength g are shown in FIG. 4a. The intensity (power) in FIG. 4a is given in arbitrary units. ω is the optical frequency, and g is an effective coupling strength. The value of ω/g=+1 corresponds to the Rabi resonance condition where a so-called "upper polariton" is formed. As shown in FIG. 4a, an upper polariton has a higher power as compared to the uncoupled photon and exciton. At ω/g=−1 a so-called "lower polariton" having a lower power as compared to the uncoupled photon and exciton is formed. The energies of upper polaritons, lower polaritons, photons, and excitons as a function of momentum are shown in FIG. 4b. For further details thereon see e.g. Kavokin, A. V. et al., "Microcavities", Oxford University Press, Oxford, 2017.

The conversion efficiency of incident light into hyperlight is determined inter alia by the radiative exciton decay rate which depends on the dimension of the cavity. A cavity defined by a $C_{60}$ molecule is referred to as a 0D cavity, i.e. a zero-dimensional cavity. The radiative decay rate $\Gamma_{0D}$ associated with a 0D cavity is given by the following expression:

$$\Gamma_{0D} = \frac{1}{4\pi\epsilon_0} \frac{2n}{3} \frac{e^2}{m_0 c} \frac{\omega^2}{c^2} f.$$

In the above expression, $\epsilon_0$ denotes the permittivity in vacuum, n denotes the electron density, e denotes the elementary charge, $m_0$ denotes the free electron mass, ω denotes the optical frequency, c denotes the speed of light, and f denotes a coupling strength.

Higher radiative decay rates and, hence, higher rates of conversion of incident light into hyperlight can be achieved by means of a 2D cavity (two-dimensional cavity). A 2D cavity can be configured by a layer structure 20 shown in FIG. 5.

Figure 5:
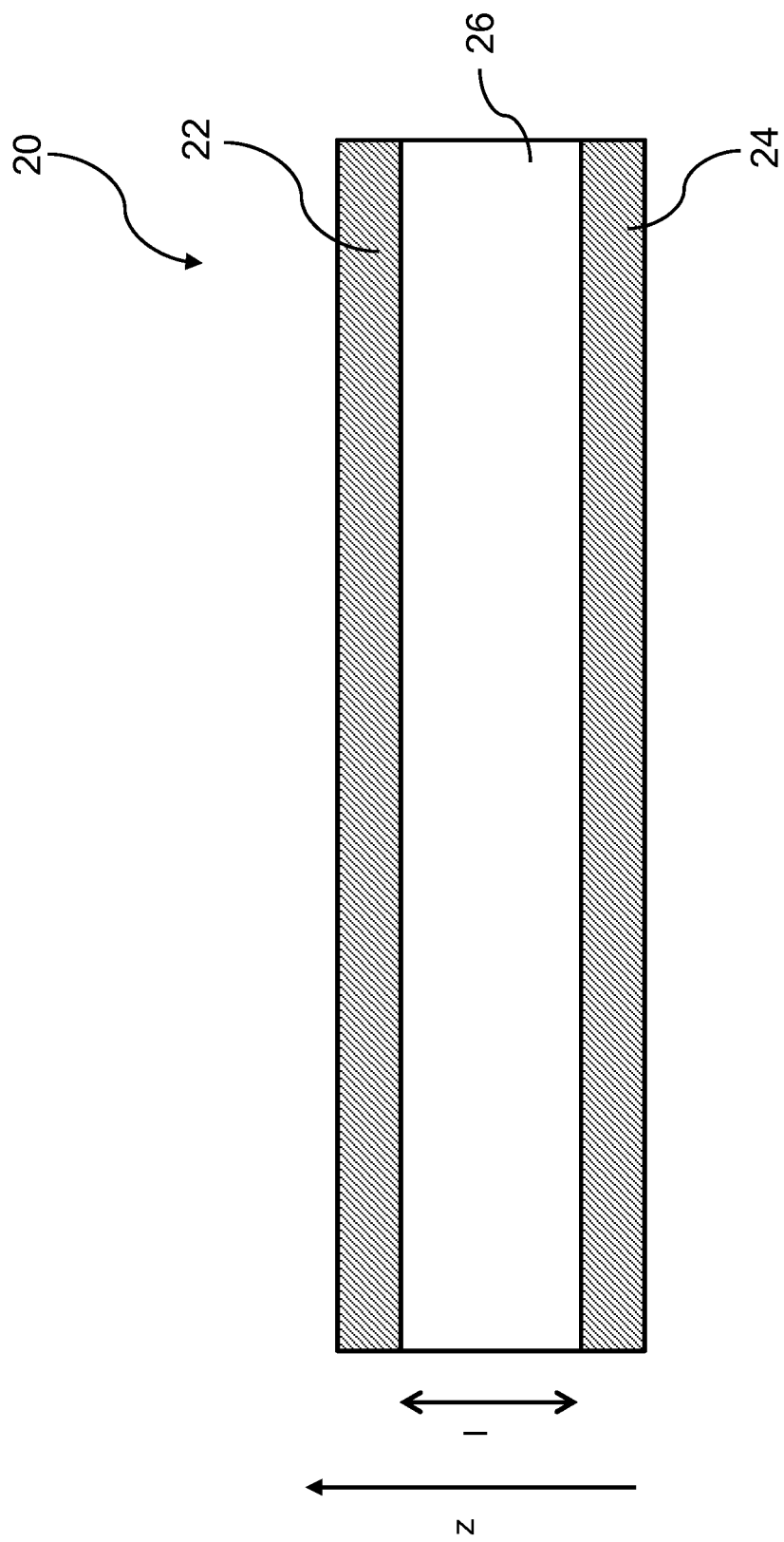
FIG. 5 is a schematic drawing illustrating an optical filter according to an exemplary embodiment of the present disclosure.

As shown in FIG. 5, the layer structure 20 may include a plurality of layers 22, 24, 26 stacked in a thickness direction z of the layer structure 20. The plurality of layers includes a plurality of nano-photonic layers 22 and 24, and a substrate layer 26 interposed between the nano-photonic layers 22, 24 in the thickness direction z. The nano-photonic layers 22, 24 may include or may be formed of nano-photonic material with icosahedral or dodecahedral symmetry, e.g. of fullerenes, in particular $C_{60}$ fullerenes. The nano-photonic layers 22, 24 may have thicknesses of 1-10 nm, optionally of 1-5 nm, further optionally of 3-5 nm.

The substrate layer 26 may be formed of an optically transparent material, e.g. of $SiO_2$ and/or $TiO_2$. The substrate layer 26 may have a thickness of 1-15 nm, optionally of 5-10 nm, further optionally of 10-15 nm.

The substrate layer 26 may be substantially free of nano-photonic material. A layer structure 20 including a substrate layer of this kind may be fabricated in a very simple way and may have a well-defined 2D cavity geometry.

Since each of the nano-photonic layers 22, 24 is formed of nano-photonic material, a 2D cavity can also be referred to as a combined 0D/2D cavity here.

The radiative decay rate $\Gamma_{2D}$ in a 2D cavity is given by the following expression $$\Gamma_{2D} \frac{1}{4\pi\epsilon_0} \frac{2\pi}{n} \frac{e^2}{m_0 c} \frac{f_{xy}}{S}.$$

In this expression, $f_{xy}$ denotes a coupling strength and S a unit area which is determined by the size of a $C_{60}$ molecule. Hence, the radiative decay rate $\Gamma_{2D}$ in a two-dimensional cavity (2D cavity of 0D/2D cavity) can be expressed in terms of the radiative decay rate in a 0D cavity $\Gamma_{0D}$.

$$\Gamma_{2D} = \left(\frac{\lambda}{2\pi l}\right)^2 \Gamma_{0D}.$$

In this expression, l represents the dimension of the 2D cavity, which may be identified as or may be related to the thickness of the substrate layer 26 in FIG. 5.

This expression clearly shows that by selecting the dimensions of the cavity, i.e. the value "l", to be small as compared to the wavelength of the incident light the radiative decay rate of excitons in a 2D cavity can be significantly increased as compared to a 0D cavity.

The effect of a combined 0D/2D cavity on incident light can be described using a Poincaré sphere. The Poincaré sphere is a tool for representing the polarization states of electromagnetic waves, such as light. Each polarization state corresponds to a point on the sphere, with fully polarized states on the surface, partially polarized states within the sphere, and the unpolarized state in the center. Linear polarizations are located at the equator of the sphere, circular polarizations at the poles, and elliptical polarizations in between. Orthogonal polarizations are located on the sphere surface opposite each other.

Figure 6:
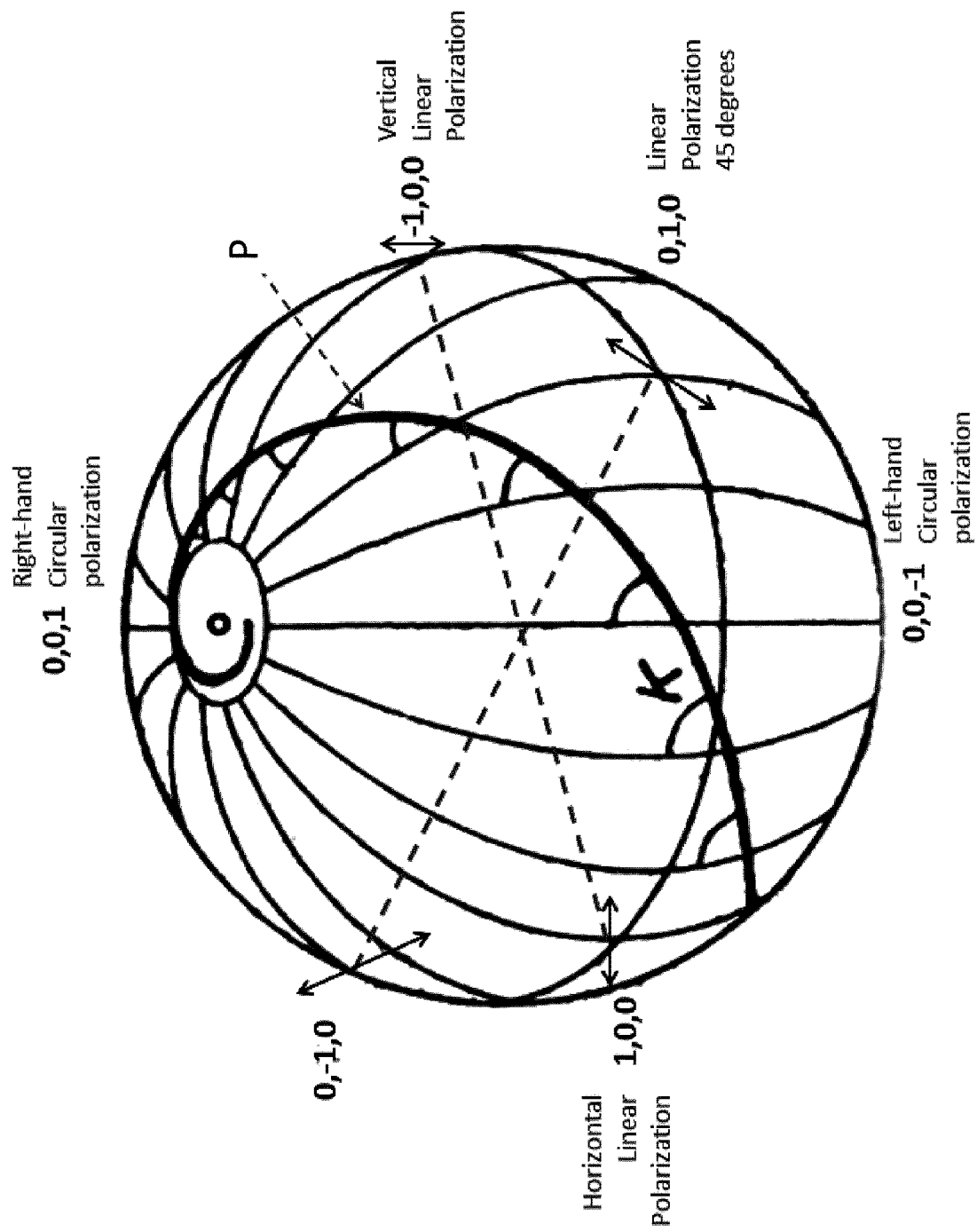
FIG. 6 illustrates the influence of a 2D cavity according to the present disclosure on the polarization states of incident light on the basis of a Poincaré sphere.

As shown in the Poincaré sphere depicted in FIG. 6, the effect of the cavity on the polarized part of the incident light can be described by the trajectory P having a curvature defined by the crossing angle κ relative to the meridians of the Poincaré sphere. The trajectory P is one of 31 possible solutions of surface distributions of the cavity dynamics. A projection of the 31 trajectories onto a plane perpendicular to the line connecting the poles yields a sunflower pattern similar to that shown in FIG. 1 which is characteristic for hyperlight.

The term "2D cavity" used here refers to a configuration including a space delimited by layers of nano-photonic material. This means for example that reflecting mirrors like in a conventional cavity are not necessary. However, having in mind that only a certain fraction of the incident photons interact with the cavity to form polaritons, it may be advantageous to provide additional substrate layers on the sides of the nano-photonic layers 22 and/or 24 opposite to the substrate layer 26 in the thickness direction z of the layer structure 20. A correspondingly configured layer structure (filter) 30 is shown in FIG. 7.

Figure 7:
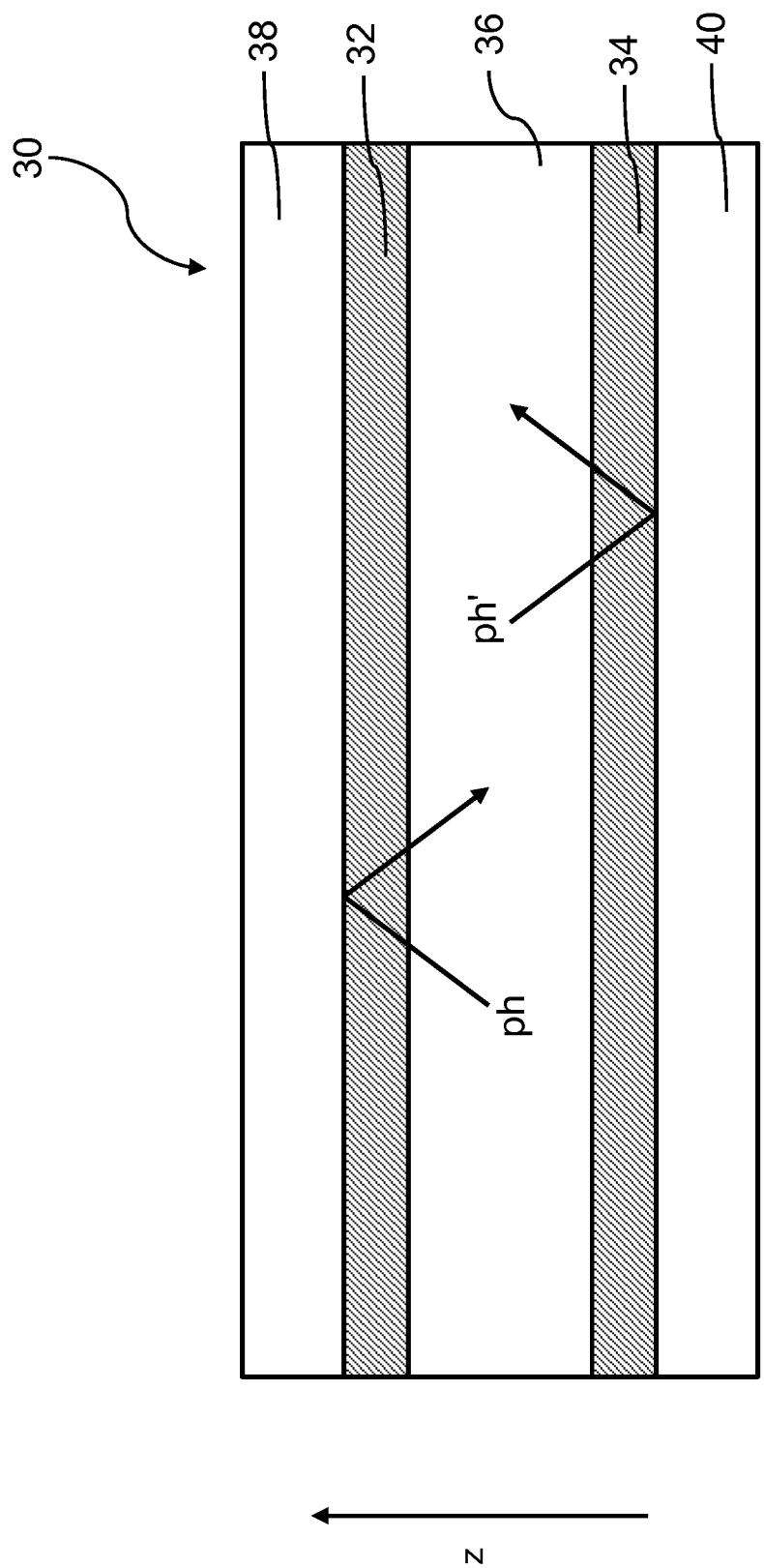
FIG. 7 is a schematic drawing illustrating an optical filter according to another exemplary embodiment of the present disclosure.

The layer structure 30 shown in FIG. 7 includes: a first nano-photonic layer 32 made of a nano-photonic material with icosahedral or dodecahedral symmetry such as $C_{60}$, a second nano-photonic layer 34 made of a nano-photonic material with icosahedral or dodecahedral symmetry such as $C_{60}$, a first substrate layer 36 made of an optically transparent material such as SiO$_2$ or TiO$_2$, a second substrate layer 38 made of an optically transparent material such as SiO$_2$ or TiO$_2$ and positioned on a side of the first nano-photonic layer 32 opposite to the first substrate layer 36 in the thickness direction z of the layer structure 30, and a third substrate layer 40 made of an optically transparent material such as SiO$_2$ or TiO$_2$ and positioned on a side of the second nano-photonic layer 34 in the thickness direction z of the layer structure 30 opposite to the first substrate layer 36.

The second and third substrate layers 38 and 40 may act, on the one hand, as protective layers to protect the first and second nano-photonic layers 32 and 34 against external influences. In addition, as indicated above, the second and third substrate layers 38 and 40 may act as mirrors, by means of which a part of the photons ph, ph' is reflected back into the first substrate layer 36 through the first nano-photonic layer 32 and the second nano-photonic layer 34, respectively. In this way, the respective photons ph, ph' can be made to traverse the respective nano-photonic layers 32 and 34 and, hence the 2D cavity, a plurality of times which in turn increases the interaction probability of these photons with the cavity and, hence, the conversion efficiency of incident light into hyperlight.

As previously mentioned, the first to third substrate layers 36, 38, 40 are made of an optically transparent material. They may be made of the same material or of mutually different materials. For example, the second and third substrate layers 38 and 40 may be made of the same material, e.g. TiO$_2$, which may be different from the material of the first substrate layer 36, which may be made of, e.g. SiO$_2$.

The materials of the substrate layers 36, 38, 40 may be selected depending on the spectral characteristics of the incident light in order to adjust the reflection characteristics depending on the wavelengths of interest.

In the following, an exemplary optical filter 100 configured according the above principles will be described with reference to FIG. 8.

The optical filter 100 may include a layer structure 102 including a plurality of layers 104a-104h and 106a-106i stacked in a thickness direction z of the layer structure 102. The plurality of layers 104a-104h and 106a-106i may include a plurality of nano-photonic layers 104a-104h formed of a nano-photonic material with icosahedral or dodecahedral symmetry and a plurality of substrate layers 106a-106i formed of an optically transparent material.

As shown in FIG. 8, the plurality of nano-photonic layers 104a-104h and the plurality of substrate layers 106a-106i may be alternately arranged in the thickness direction z of the layer structure 102. Consequently, in this structure each of the substrate layers 106b-106h interposed between respective two adjacent nano-photonic layers 104a-104h defines with the adjacent nano-photonic layers a 2D cavity structure shown in FIG. 5. In addition, three consecutive substrate layers and the respective nano-photonic layers interposed therebetween correspond to the layer structure shown in FIG. 7. Hence, the description of the layer structures shown in FIG. 5 and FIG. 7 applies also to the optical filter 100 shown in FIG. 8.

As set forth above, the nano-photonic material may comprise fullerene molecules, in particular C$_{60}$ fullerene molecules.

Having in mind that the radiative decay rate of excitons in a 2D cavity is given by the expression $$\Gamma_{2D} = \left(\frac{\lambda}{2\pi l}\right)^2 \Gamma_{0D},$$

it may be advantageous to select the dimensions of at least one of the cavities to be much smaller than the wavelengths of interest. For wavelengths in the visible frequency range, at least one of the substrate layers 106a-106i may have a thickness in a range selected from 5-30 nm, 5-15 nm, and 5-10 nm.

In an exemplary embodiment, the thicknesses of the substrate layers 106a-106i may be selected as follows: substrate layer 106a (formed of, e.g. SiO$_2$): 50-100 nm, substrate layer 106b (formed of, e.g. TiO$_2$): 5-10 nm, substrate layer 106c (formed of, e.g. SiO$_2$): 10-15 nm, substrate layer 106d (formed of, e.g. TiO$_2$): 5-10 nm, substrate layer 106e (formed of, e.g. SiO$_2$): 10-15 nm, substrate layer 106f (formed of, e.g. TiO$_2$): 5-10 nm, substrate layer 106g (formed of, e.g. SiO$_2$): 5-10 nm, substrate layer 106h (formed of, e.g. TiO$_2$): 5-10 nm, and substrate layer 106i (formed of, e.g. SiO$_2$): 50-100 nm. Here, the thicknesses of the outermost substrate layers 106a and 106i in the thickness direction z of the layer structure 102 may have significantly higher thicknesses than the other substrate layers 106b-106h. These substrate layers 106a and 106i may, hence, serve as protective layers of the layer structure 102.

Hence, as can be seen from this example in a layer structure of an optical filter according to the present disclosure, the substrate layers may be provided with different thicknesses for example to control the propagation direction of light in the layer structure.

At least one of the substrate layers 106a-106i, optionally a plurality thereof, or further optionally all of the substrate layers 106a-106i, may be substantially free of nano-photonic material in order to ensure a well-defined cavity geometry in which the exciton decay rate can be precisely adjusted for a specific wavelength.

In addition, at least one of the nano-photonic layers 104a-104h, optionally a plurality thereof, or further optionally all of the nano-photonic layers 104a-104h, may be substantially free of the optically transparent material of the substrate layers 106a-106i. In an exemplary embodiment, the weight fraction of nano-photonic material in at least one of the nano-photonic layers 104a-104h, optionally in a plurality of the nano-photonic layers 104a-104h, further optionally in all of the nano-photonic layers 104a-104h, is higher than 99%. In this way, a high conversion efficiency of incident light into hyperlight can be ensured.

The substrate layers 106a-106i may be made of the same optically transparent material. Alternatively, at least two of the plurality of substrate layers 106a-106i may be made of mutually different materials with mutually different refractive indices. As explained in the foregoing, in this way the reflection characteristics of the layer structures at the respective interfaces between the substrate layers may be adjusted for the wavelengths of interest.

To avoid an excessive absorption of light in the nano-photonic layers 104a-104h, their thicknesses may be in a range selected from: 3-10 nm, 3-7 nm, and 3-5 nm. In the exemplary embodiment shown in FIG. 8, all nano-photonic layers 104a-104h may have thicknesses in a range of 3-5 nm.

The layer structures disclosed herein may be fabricated for example by means of chemical or physical vapor deposition.

As shown in FIG. 8, the filter 100 may further include a carrier 108 supporting the layer structure 102. The carrier 108 may be made of an optically transparent material such as PMMA, CR39, or glass. The carrier may have a transmittance for visible light of at least 70%.

Even though not shown in FIG. 8, the carrier 108 may be provided on opposite sides thereof with a layer structure 102. In addition, the carrier 108 may include nano-photonic material 108a with icosahedral or dodecahedral symmetry, such as $C_{60}$, dispersed therein or deposited as a layer 108b on a surface thereof. In this way, the carrier 108 may also contribute to the generation of hyperlight, e.g. by means of resonant emission of the energy eigenstates $T_{1g}$, $T_{2g}$, $T_{1u}$, and $T_{2u}$ of $C_{60}$. In this way, the conversion efficiency of incident light into hyperlight may be increased. The weight concentration of the nano-photonic material 108a in the carrier 108 may range between 0.001-0.050.

The carrier 108 does not have to be configured as a planar member as exemplarily shown in FIG. 8, but may be alternatively configured as a curved body, e.g. as a lens, in particular as a spectacle lens. Exemplary spectacles 200 including a pair of lenses 220 equipped with optical filters 100 described above are shown in FIG. 9a. By means of the spectacles depicted in FIG. 9a, incident light is converted into hyperlight the characteristics of which are determined by the golden ratio, as explained on the basis of FIG. 1. It is known, e.g. from US 2008/286453 A1, that the clock cycle of the human brain obeys the golden ratio. Experiments have shown that by exposing the eyes of a test person to light the characteristics of which are determined by the golden ratio, the brain function can be normalized. Hence, wearing spectacles like those shown in FIG. 9a may help normalizing the brain function, thereby improving the general wellbeing.

Figure 9B:
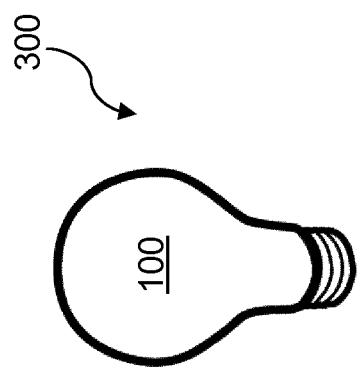
FIGS. 9a-9d are schematic drawings illustrating possible applications of optical filters according to the present disclosure.
Figure 9D:
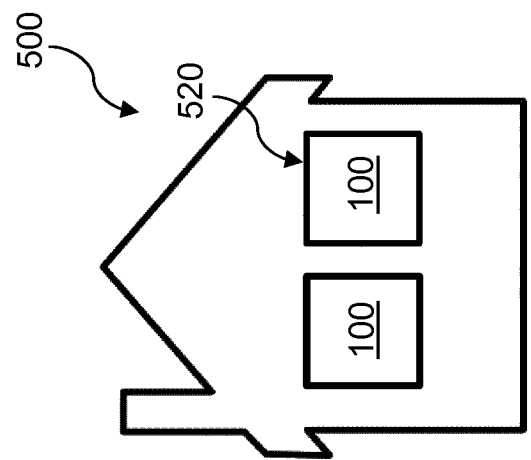
Figure 9A:
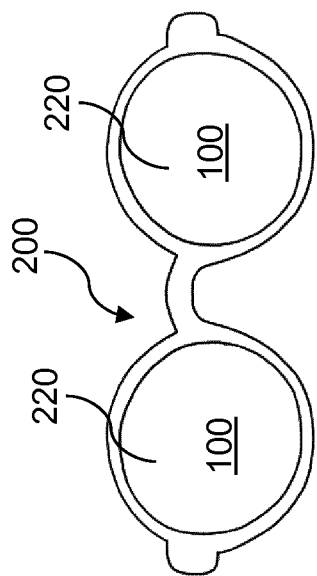

The spectacles 200 shown in FIG. 9a may be subjected to sun light. However, since the optical filter according to the present invention is configured to convert any type of light (i.e. any wavelength) into hyperlight, a harmonization (normalization) of the brain function can be also achieved by means of artificial light generated by lighting means 300 equipped with an optical filter 100 according to the present disclosure, as shown in FIG. 9b. In this case no spectacles need to be carried to achieve the above effect.

Figure 9C:
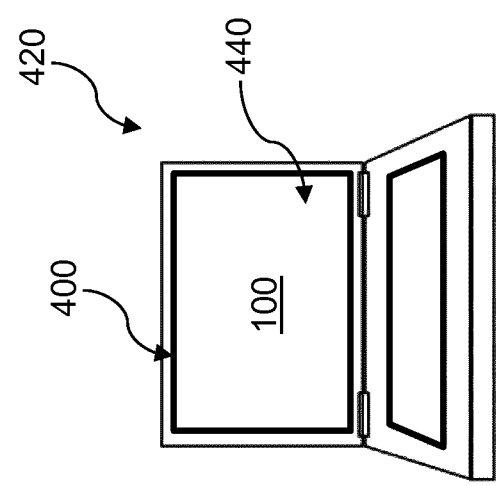

A similar effect can be achieved by means of light emitted by other artificial light sources such as a display 400, e.g. of a portable computer or of a toy 420. In an exemplary embodiment, the optical filter 100 may be configured as a display protective foil 440, as exemplarily indicated in FIG. 9c.

In another exemplary embodiment, an optical filter 100 may be provided as or on a window 520 of a building 500 or may be configured as part of said window 520. In this way, a significant part of the light (e.g. sun light or artificial light) entering the building 500 may be converted into hyperlight. Filters 100 according to the present disclosure may be applied to any kind of windows including road vehicle windows, aircraft windows, and watercraft windows.

Figure 10:
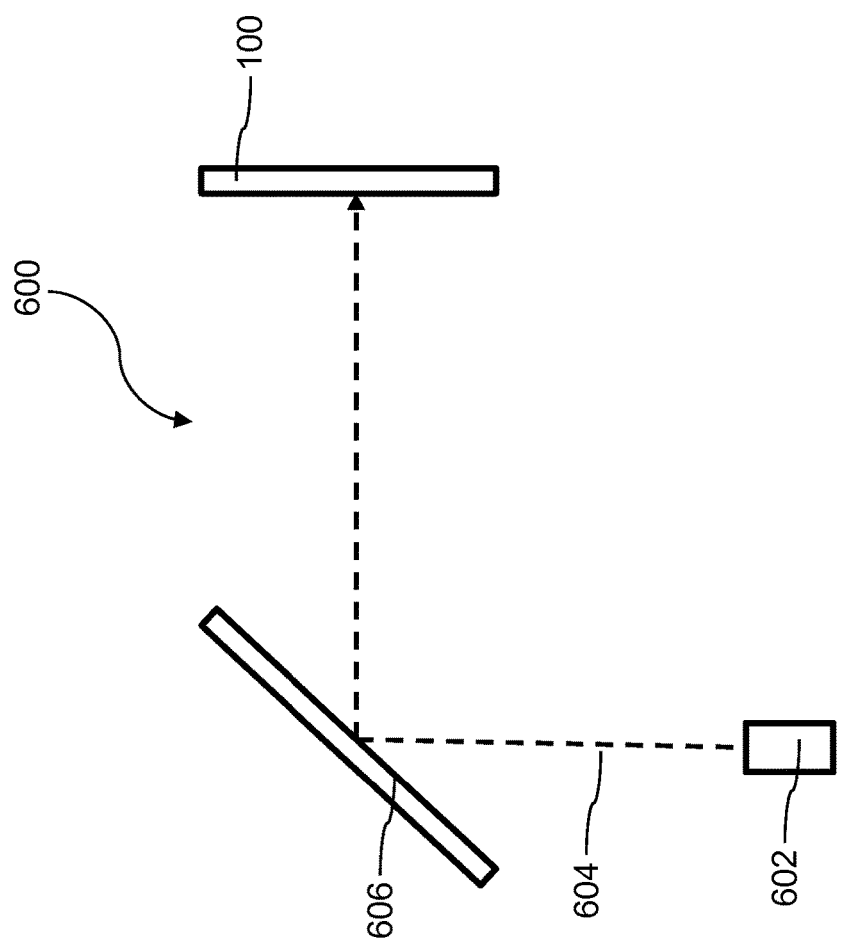
FIG. 10 is a schematic drawing illustrating an exemplary therapeutic lamp including an optical filter according to the present disclosure.

A filter 100 according to the present disclosure may also be employed in a therapeutic lamp 600 which will be referred to in the following as a hyperlight generation device or hyperlight device. An exemplary hyperlight device 600 is shown in FIG. 10. The hyperlight device 600 may include a light source 602 and an optical filter 100 described above. The light source 602 may be configured as a source adapted to emit visible light, e.g. as a halogen lamp.

The hyperlight device 600 may further include a polarizer 606 positioned along a light path 604 between the light source 602 and the filter 100. The polarizer 606 may be configured as a linear polarizer adapted to convert the light emitted by the light source 602 into linearly polarized light. The polarizer 606 may be configured as a beam-splitting polarizer such as a Brewster polarizer as indicated in FIG. 10.

By means of a hyperlight device 600 depicted in FIG. 10, light emitted by the light source 602 may be first converted into polarized light by means of the polarizer 606, and then into hyperlight by means of the filter 100, i.e. into polarized hyperlight which is also referred to as "hyperpolarized light" in the art. The photons of hyperpolarized light are ordered both by energy and angular momentum. It should be noted that in the hyperlight device 600 the polarizer 606 is not mandatory.

The interaction of light with a filter according to the present disclosure does not only affect the spatial distribution of photons according to their angular momenta, but may also change the spectral characteristics of the light. Experimental results showing this aspect of the filters according to the present disclosure, in particular of the filter shown in FIG. 8, will be explained in the following with reference to FIGS. 11 to 25.

Figure 11:
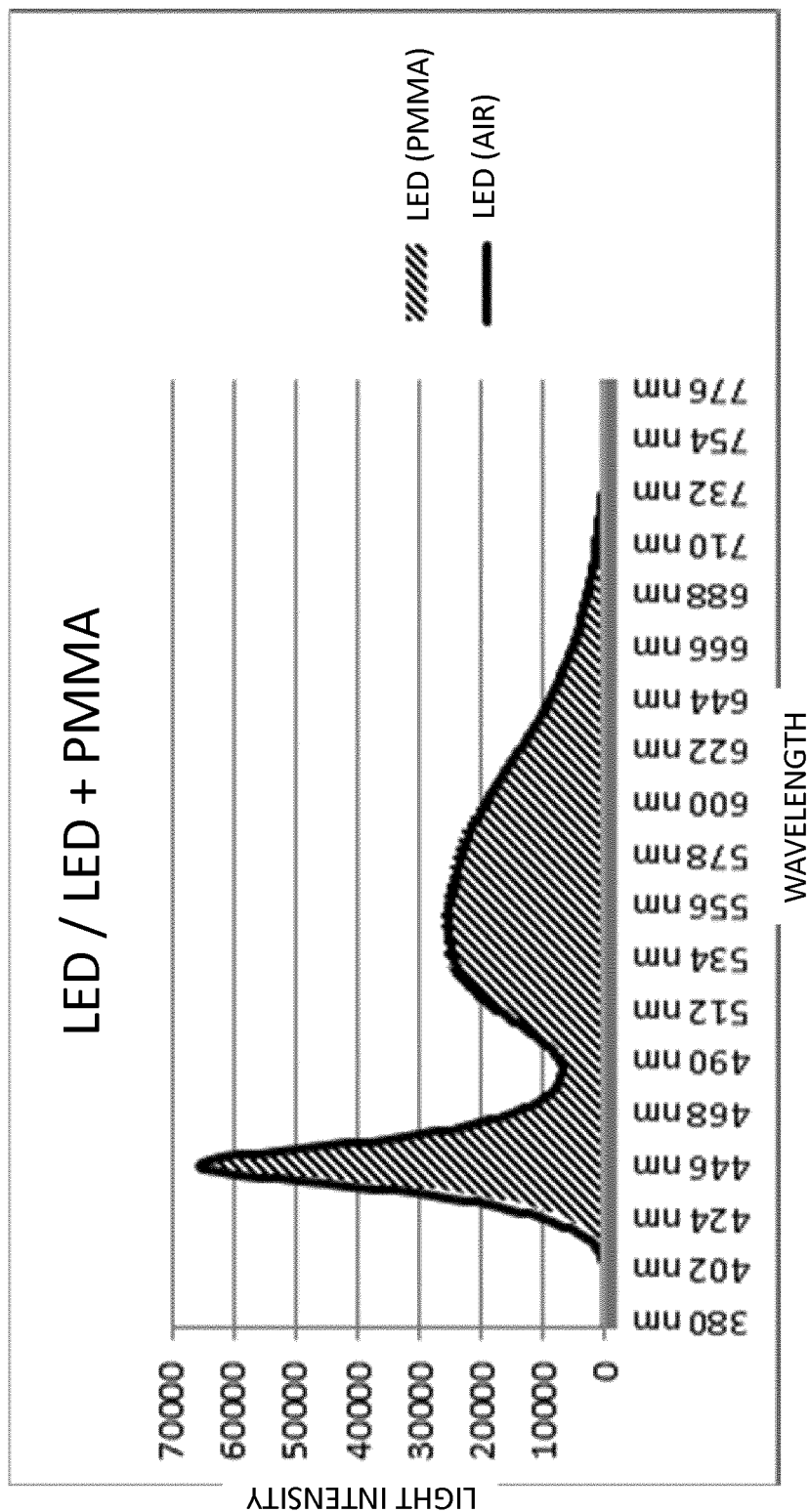
FIGS. 11-24 are graphs illustrating characteristics of filters according to the present disclosure.

FIG. 11 shows the spectrum of light emitted by an LED after passage through air. This spectrum is indicated by the solid black line in FIG. 11 and is referred to as "LED (AIR)". In addition, the spectrum of light emitted by the same LED after passage through a PMMA substrate, which does not include nano-photonic material, is shown as a hatched area in FIG. 11. This spectrum is referred to as "LED (PMMA)" in FIG. 11.

As can clearly be seen in FIG. 11, in the wavelength range of ~400-700 nm there is no significant difference between both spectra, meaning that the PMMA does not significantly change the spectral characteristics of the light emitted by the LED.

Figure 12:
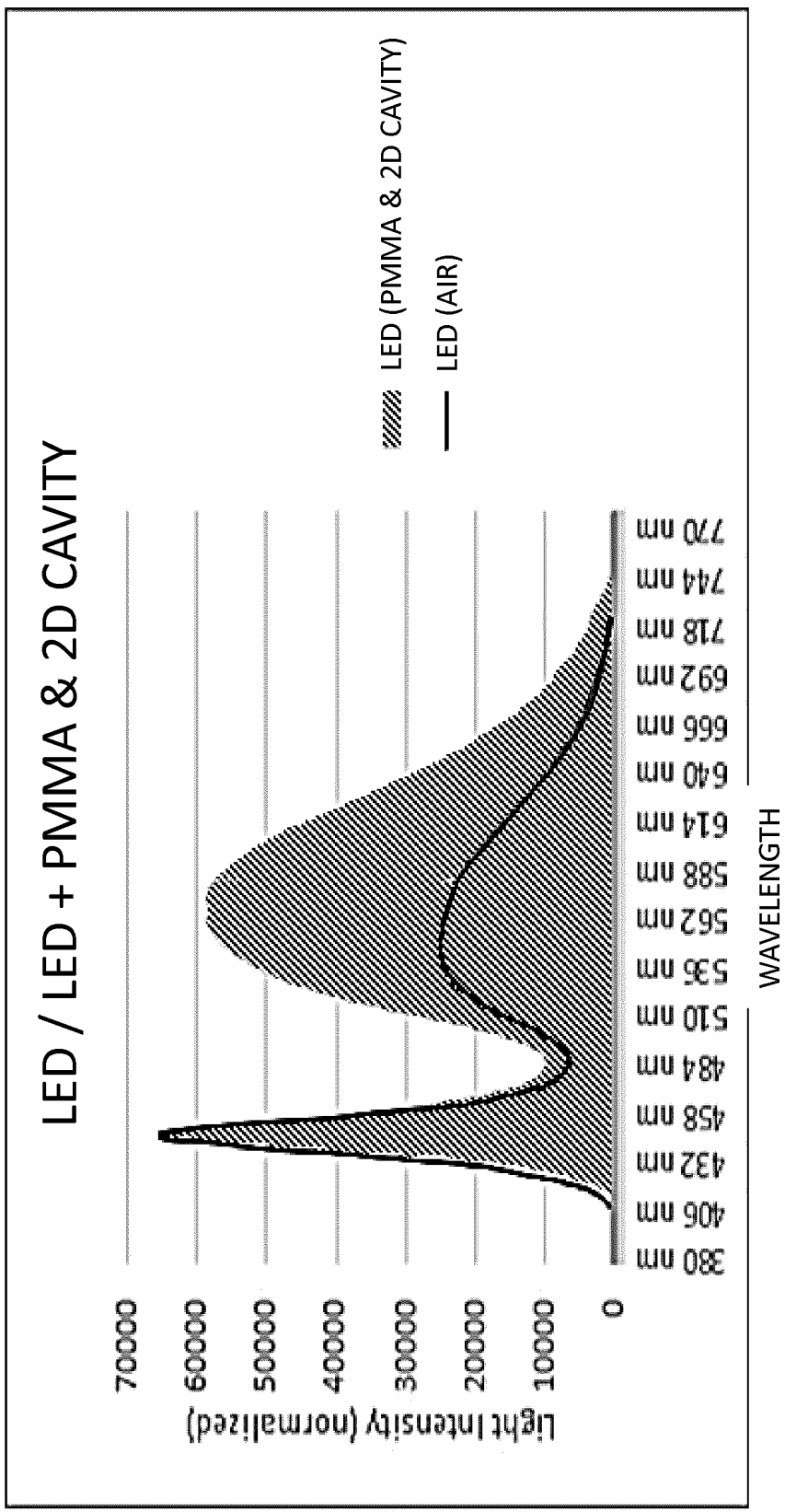

FIG. 12 shows the spectrum of the light emitted by the LED after passage through air. This spectrum is indicated by the solid black line in FIG. 12 and is referred to as "LED (AIR)". In addition, the spectrum of light emitted by the same LED after passage through a PMMA substrate equipped with a 0D/2D cavity (filter) described in the foregoing is shown as a hatched area. This spectrum is referred to as "LED (PMMA & 2D CAVITY)" in FIG. 12. The PMMA substrate corresponds to a previously described carrier and may optionally include $C_{60}$ molecules dispersed therein.

Figure 13:
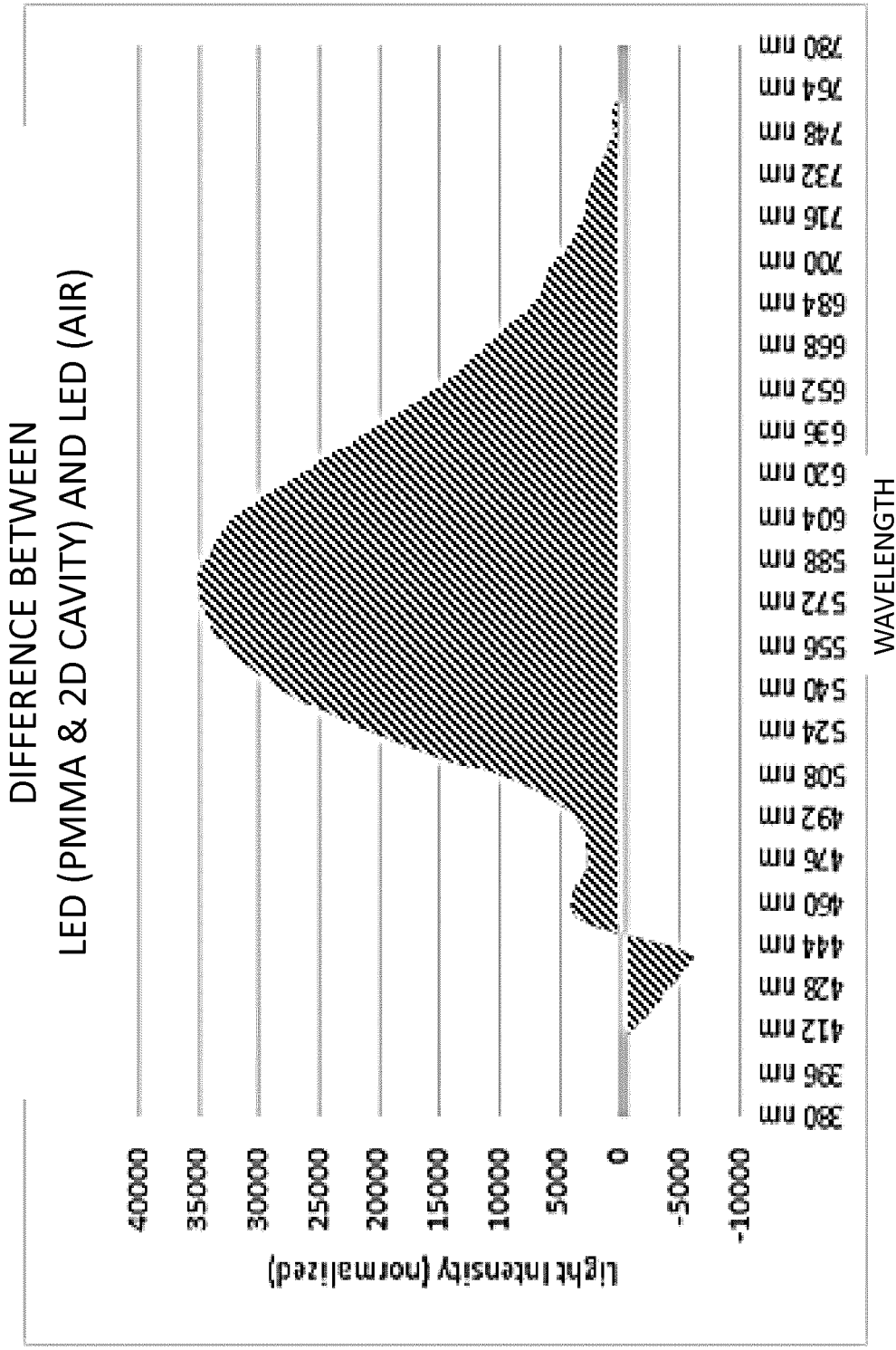

The difference between the spectra shown in FIG. 12, i.e. between LED (PMMA & 2D CAVITY) and LED (AIR) is depicted in FIG. 13 as a hatched area.

As can clearly be seen from the spectra shown in FIGS. 12 and 13, by means of the 2D cavity high frequencies in the LED spectrum are converted into frequency components with lower energy in the visible spectrum. Consequently, the effect of the 2D cavity on the light spectrum significantly differs from the effect exerted by a conventional filter that simply suppresses certain spectral components by absorption and, hence, reduces the integral light intensity. More specifically, since a filter according to the present disclosure is configured to convert high-energetic light into low-energetic light, the integral intensity in the visible range is not affected at all or at least to a much lesser extent as compared to conventional optical filters.

For these reasons, optical filters according to the present disclosure may be employed as filters in spectacles, since they are configured to reduce the intensity of incident light in a spectral range potentially harmful for the human eye, while keeping the integral intensity high.

Figure 14:
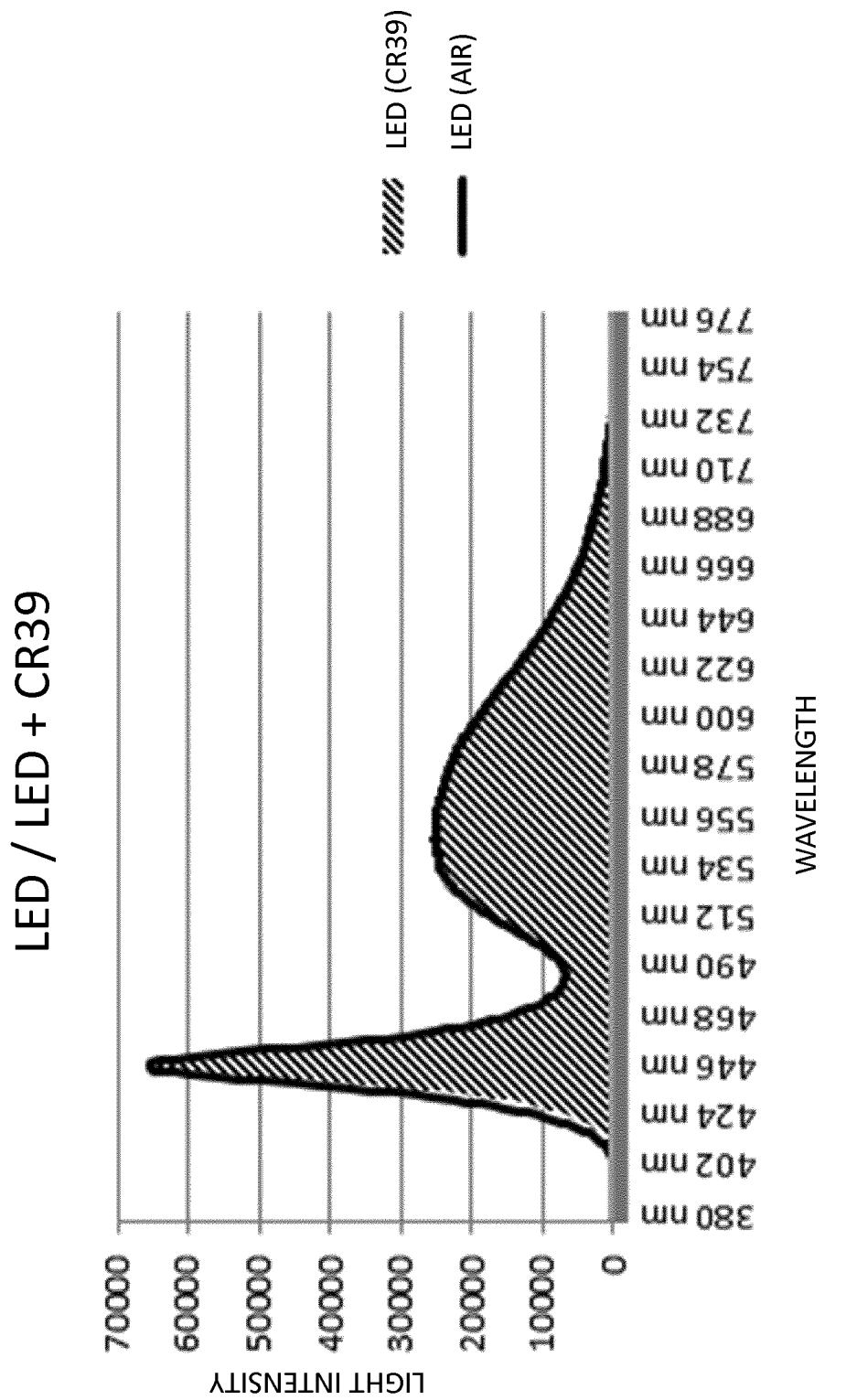

FIG. 14 shows the spectrum of light emitted by an LED after passage through air. This spectrum is indicated by the solid black line in FIG. 14 and is referred to as "LED (AIR)". In addition, the spectrum of light emitted by the same LED after passage through a CR39 substrate, that does not include nano-photonic material, is shown as a hatched area. This spectrum is referred to as "LED (CR39)" in FIG. 14. CR39 (allyl diglycol carbonate (ADC)) is a plastic polymer commonly used in the manufacture of eyeglass lenses. The CR39 substrate corresponds to a previously described carrier and may optionally include $C_{60}$ molecules dispersed therein or deposited as a thin layer on one of its surfaces.

As can clearly be seen, in the wavelength range of ~400-700 nm there is no significant difference between both spectra, meaning that the CR39 substrate does not significantly change the spectral characteristics of the light emitted by the LED.

Figure 15:
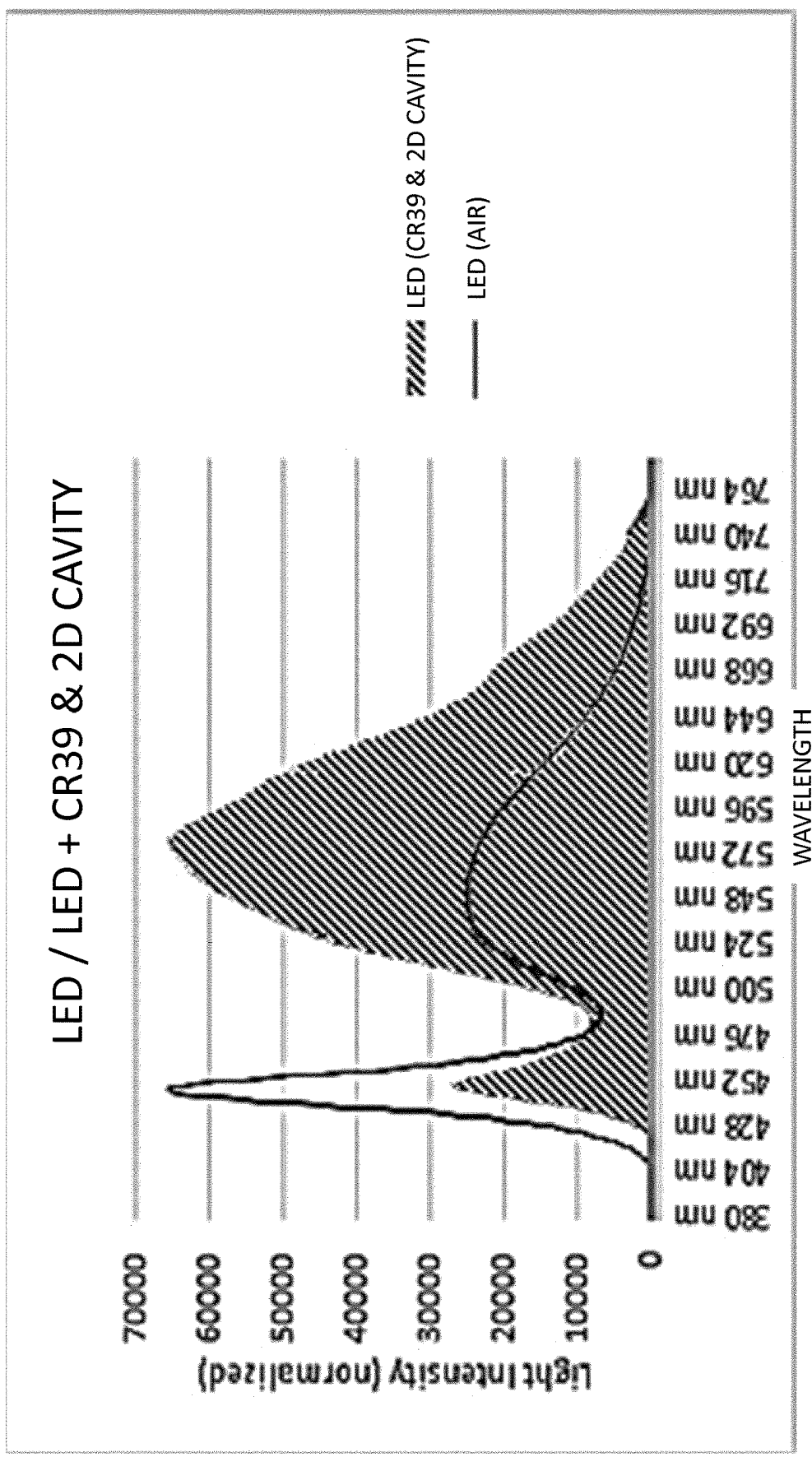
Figure 16:
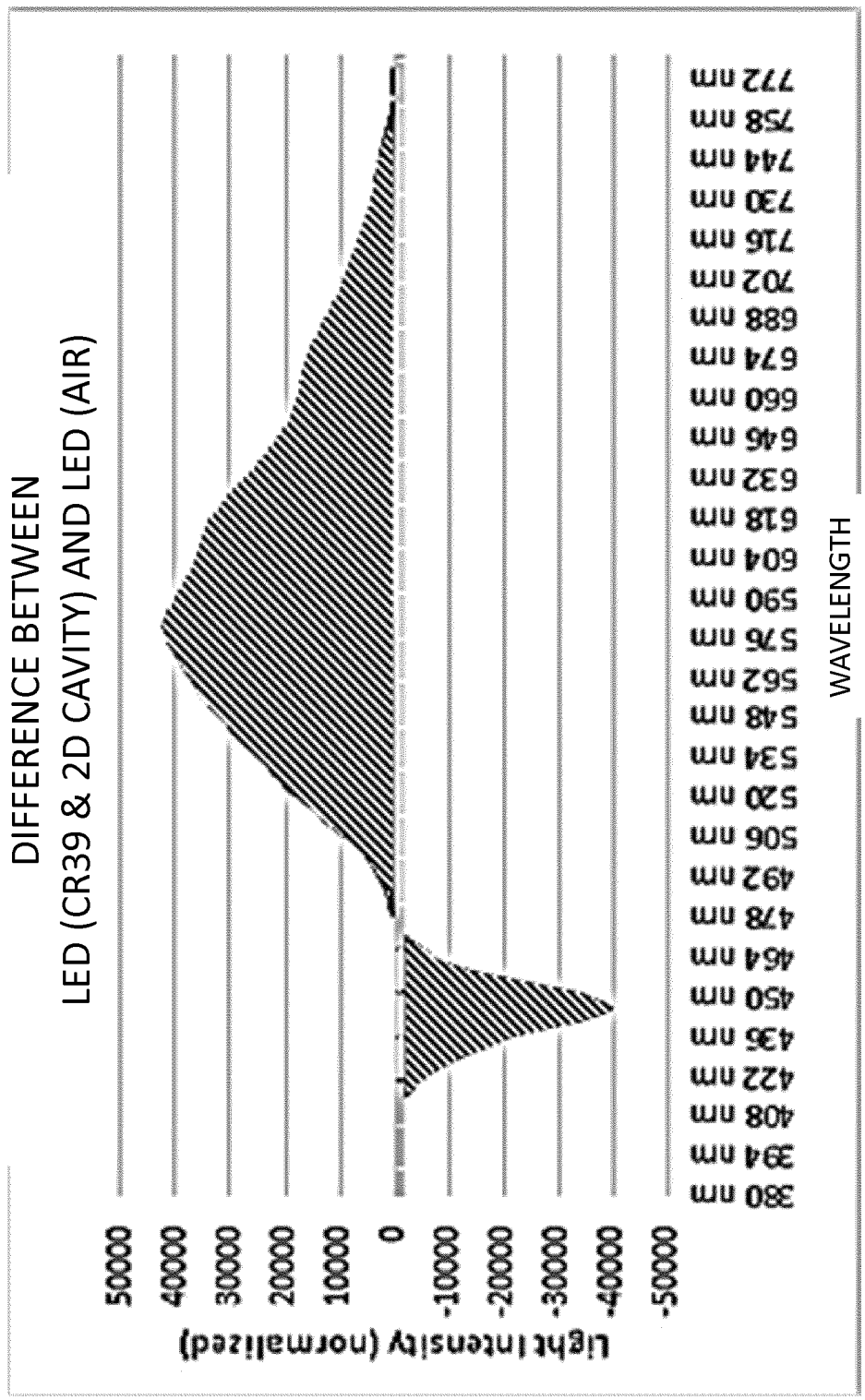

FIG. 15 shows again the spectrum of the light emitted by the LED after passage through air. This spectrum is indicated by the solid black line in FIG. 15 and is referred to as "LED (AIR)". In addition, the spectrum of light emitted by the same LED after passage through a CR39 substrate equipped with a 2D cavity (filter) described in the foregoing is shown as a hatched area. This spectrum is referred to as "LED (CR39 & 2D CAVITY)" in FIG. 15. The difference between the spectra shown in FIG. 15, i.e. between the spectra referred to as "LED (CR39 & 2D CAVITY)" and "LED (AIR)" in FIG. 15, is depicted in FIG. 16 as a hatched area.

These measurements confirm the results obtained on the basis of an optical filter including a PMMA substrate, i.e. by means of the 2D cavity the power of incident light in the high-energetic wavelength range of 400-470 nm is converted into light with a lower energy in the wavelength range of between 470-770 nm.

The above results do not depend on the specific light source used. This will be set forth in the following with respect to FIGS. 17 to 22 showing measurements obtained on the basis of Neon light emitted by conventional Neon lamps (tubes) as used, e.g. in offices.

Figure 17:
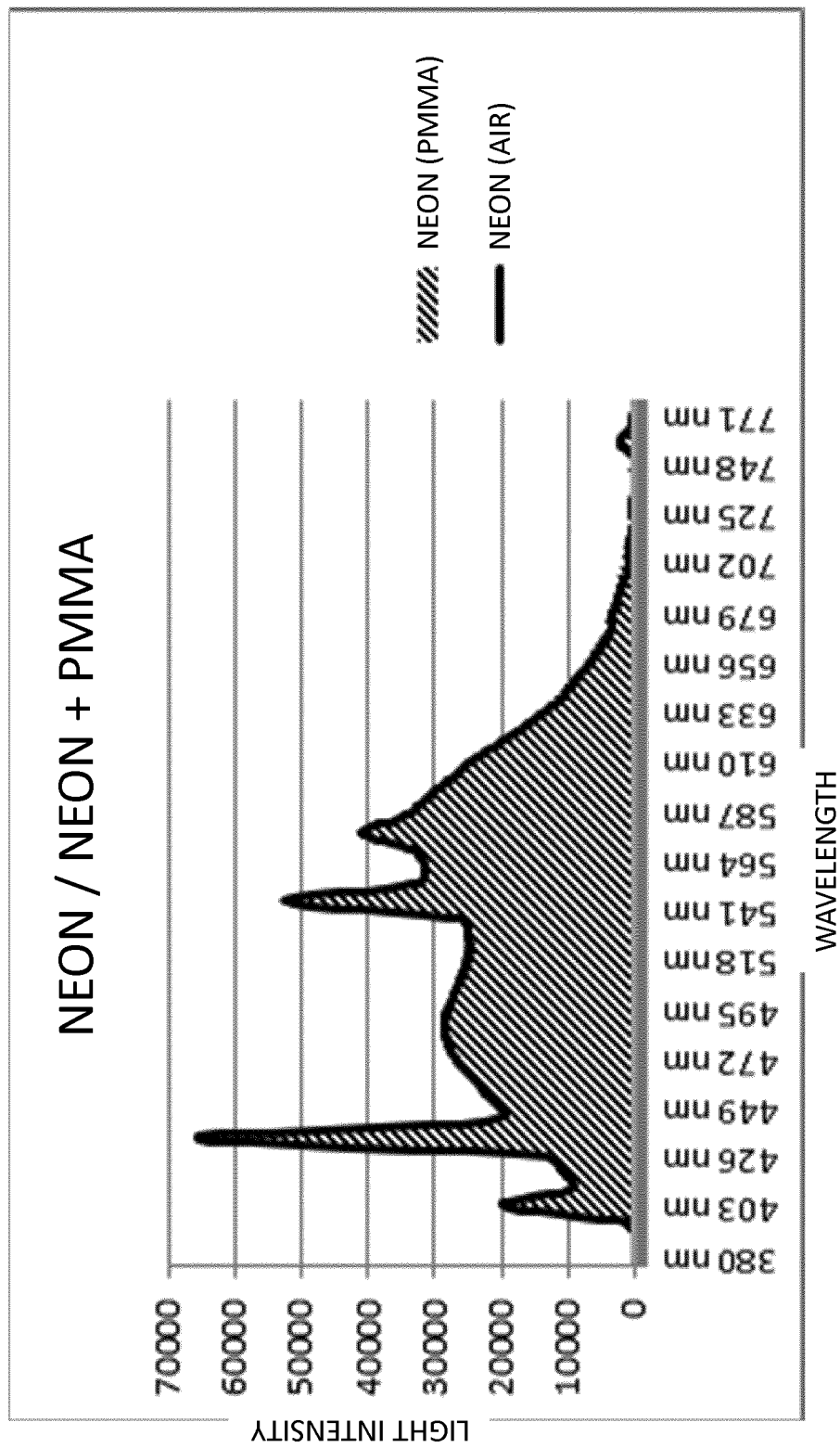

In detail, FIG. 17 shows the spectrum of Neon light after passage through air. This spectrum is indicated by the solid black line in FIG. 17 and is referred to as "NEON (AIR)". In addition, the spectrum of the Neon light after passage through a PMMA substrate, that does not include nano-photonic material, is shown as a hatched area. This spectrum is referred to as "NEON (PMMA)" in FIG. 17.

As can clearly be seen in FIG. 17, in the wavelength range of ~400-700 nm there is no significant difference between both spectra, meaning that the PMMA substrate does not significantly change the spectral characteristics of the Neon light.

FIG. 18 shows again the spectrum of the Neon light after passage through air. This spectrum is indicated by the solid black line in FIG. 18 and is referred to as "NEON (AIR)". In addition, the spectrum of the Neon light after passage through a PMMA substrate equipped with a 2D cavity, i.e. an optical filter, described in the foregoing is shown as a hatched area. This spectrum is referred to as "NEON (PMMA & 2D CAVITY)" in FIG. 18. The difference between the spectra shown in FIG. 18, i.e. between NEON (PMMA & 2D CAVITY) and NEON (AIR), is depicted in FIG. 19 as a hatched area.

Figure 18:
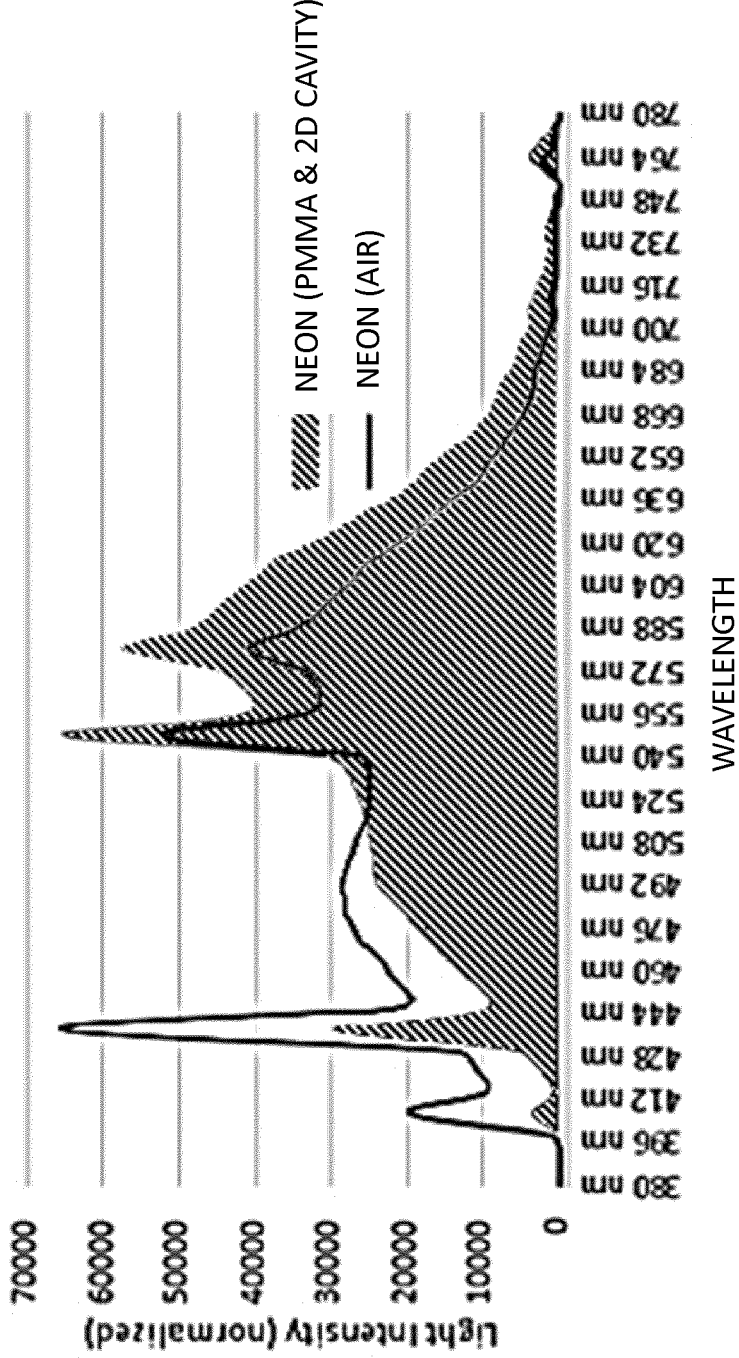
Figure 19:
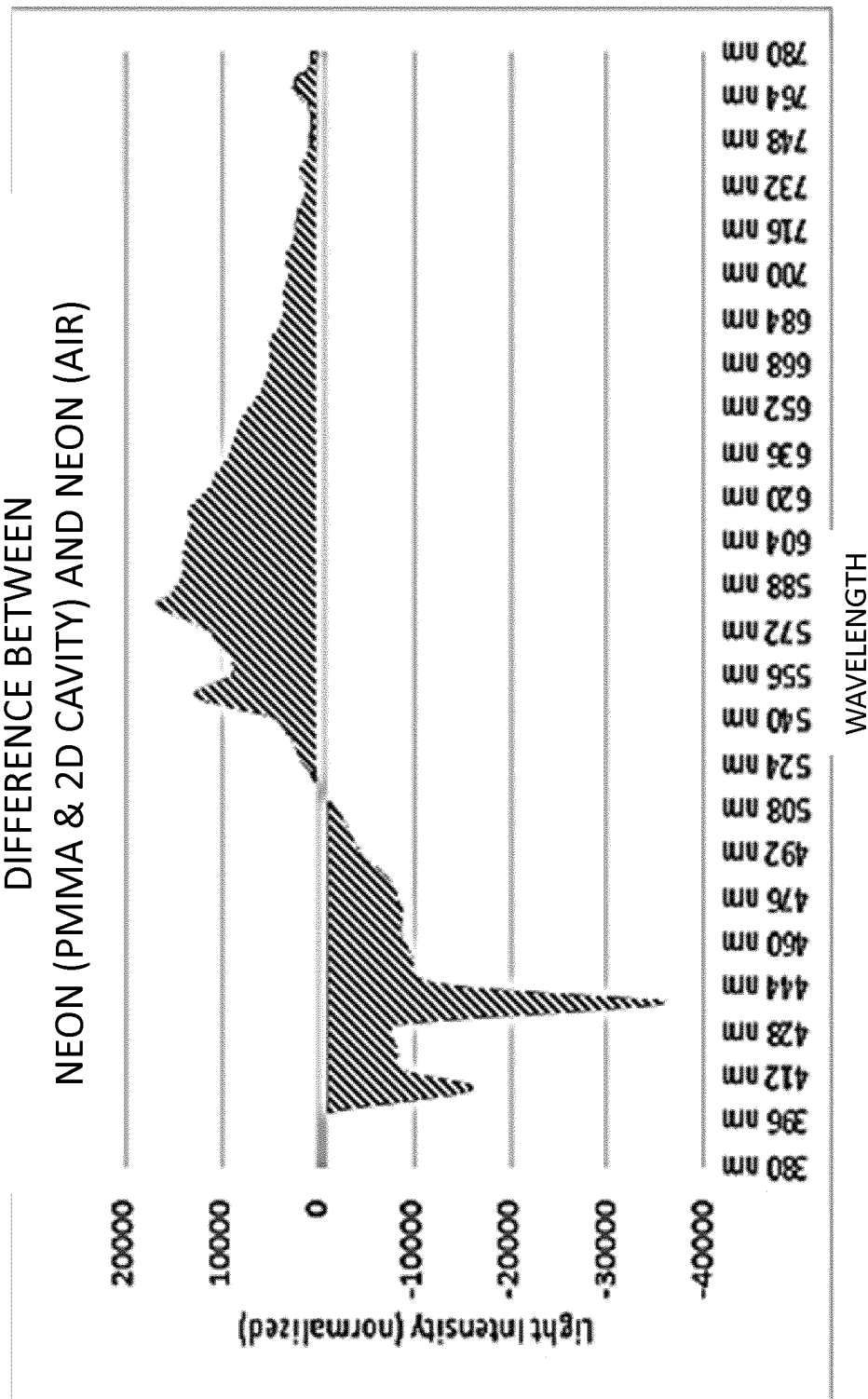

FIGS. 18 and 19 confirm the results obtained on the basis of LED light, i.e. the filter attenuates the intensity of the high-energetic light by conversion into lower energetic light.

Figure 20:
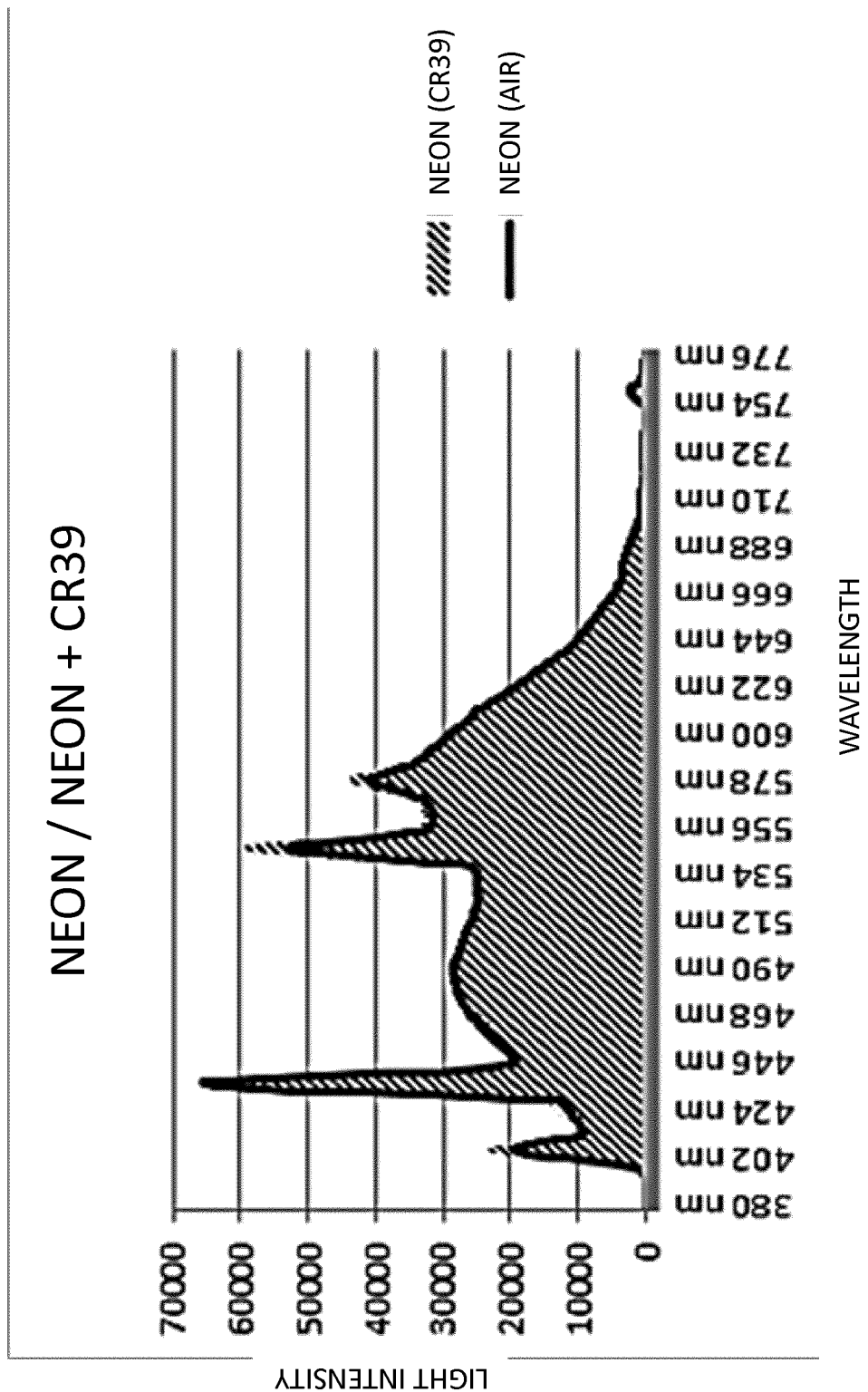
Figure 21:
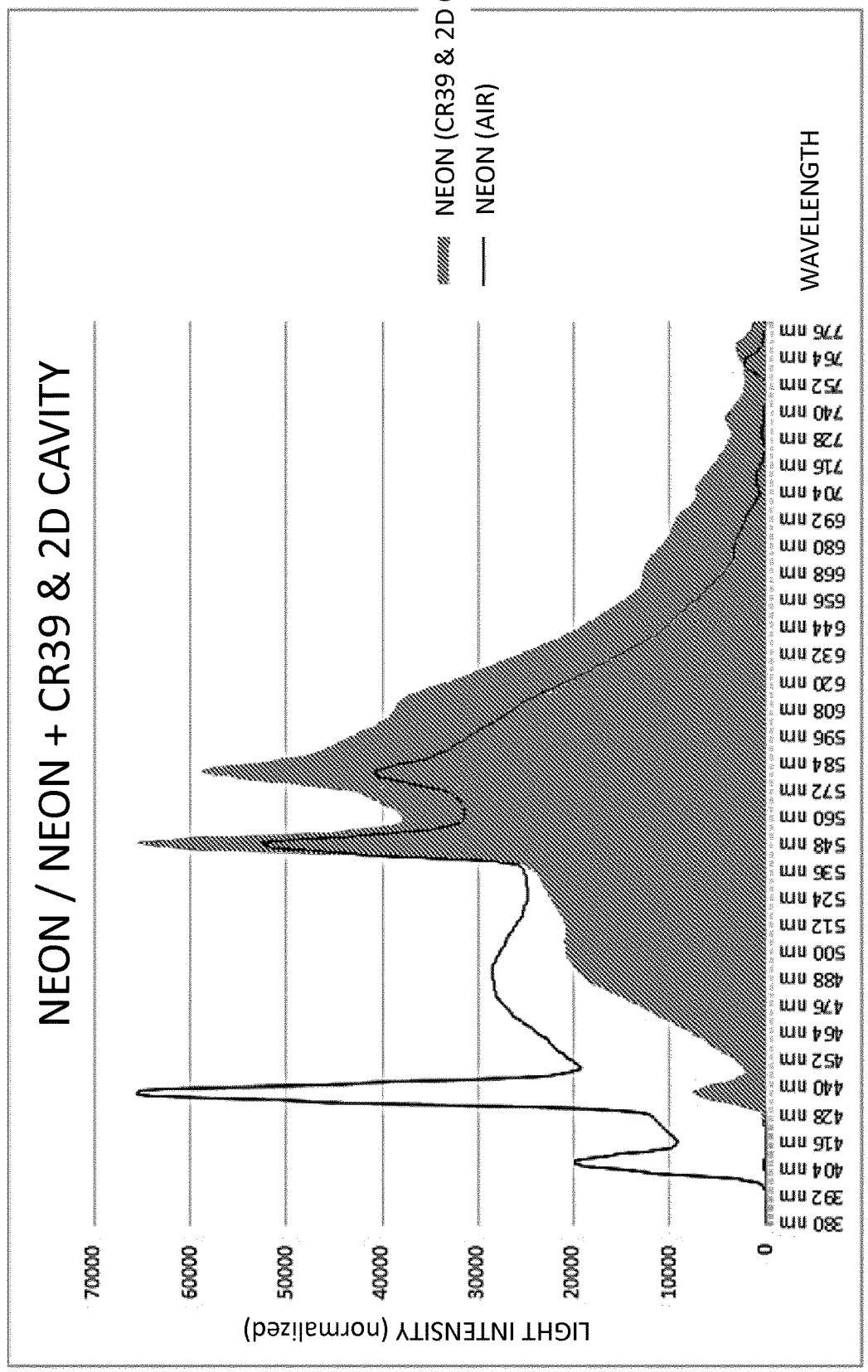

FIG. 20 shows the spectrum of Neon light after passage through air. This spectrum is indicated by the solid black line in FIG. 20 and is referred to as "NEON (AIR)". In addition, the spectrum of the Neon light after passage through a CR39 substrate, that does not include nano-photonic material, is shown as a hatched area. This spectrum is referred to as "NEON (CR39)" in FIG. 20.

As can clearly be seen, in the wavelength range of ~400-700 nm there is no significant difference between both spectra, meaning that the CR39 substrate does not significantly change the spectral characteristics of the Neon light.

Figure 22:
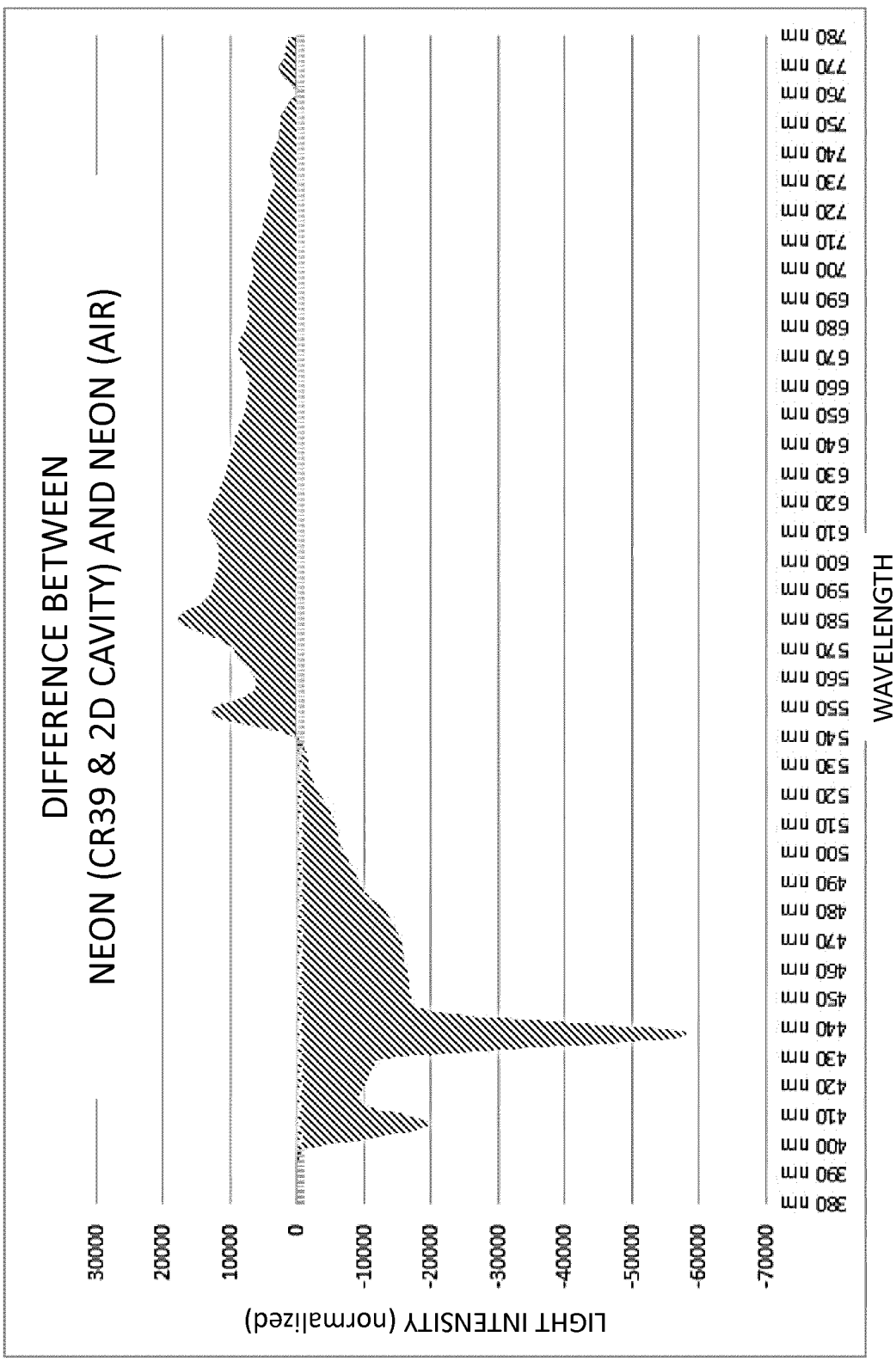

FIG. 21 shows again the spectrum of the Neon light after passage through air. This spectrum is indicated by the solid black line in FIG. 21 and is referred to as "NEON (AIR)". In addition, the spectrum of the Neon light after passage through a CR39 substrate equipped with a 2D cavity (filter) described in the foregoing is shown as a hatched area. This spectrum is referred to as "NEON (CR39 & 2D CAVITY)" in FIG. 21. The difference between the spectra shown in FIG. 21, i.e. between NEON (CR39 & 2D CAVITY) and NEON (AIR), is depicted in FIG. 22 as a hatched area.

The results of the measurements shown in FIGS. 14 to 22 consistently show that the filters according to the present disclosure are configured to convert high-energetic light into lower energetic light in the visible spectral range, and that this effect does not depend on the light source. This in turn clearly demonstrates the high versatility of the optical filters according to the present disclosure.

As can be seen from the above spectra, the light sources used in the above-discussed measurements do not comprise spectral components with significant intensities at wavelengths higher than 700 nm, i.e. in the IR regime. Therefore, to analyze the influence of an optical filter according to the present disclosure on infrared light (IR), additional measurements have been carried out using sun light as incident light.

Figure 23:
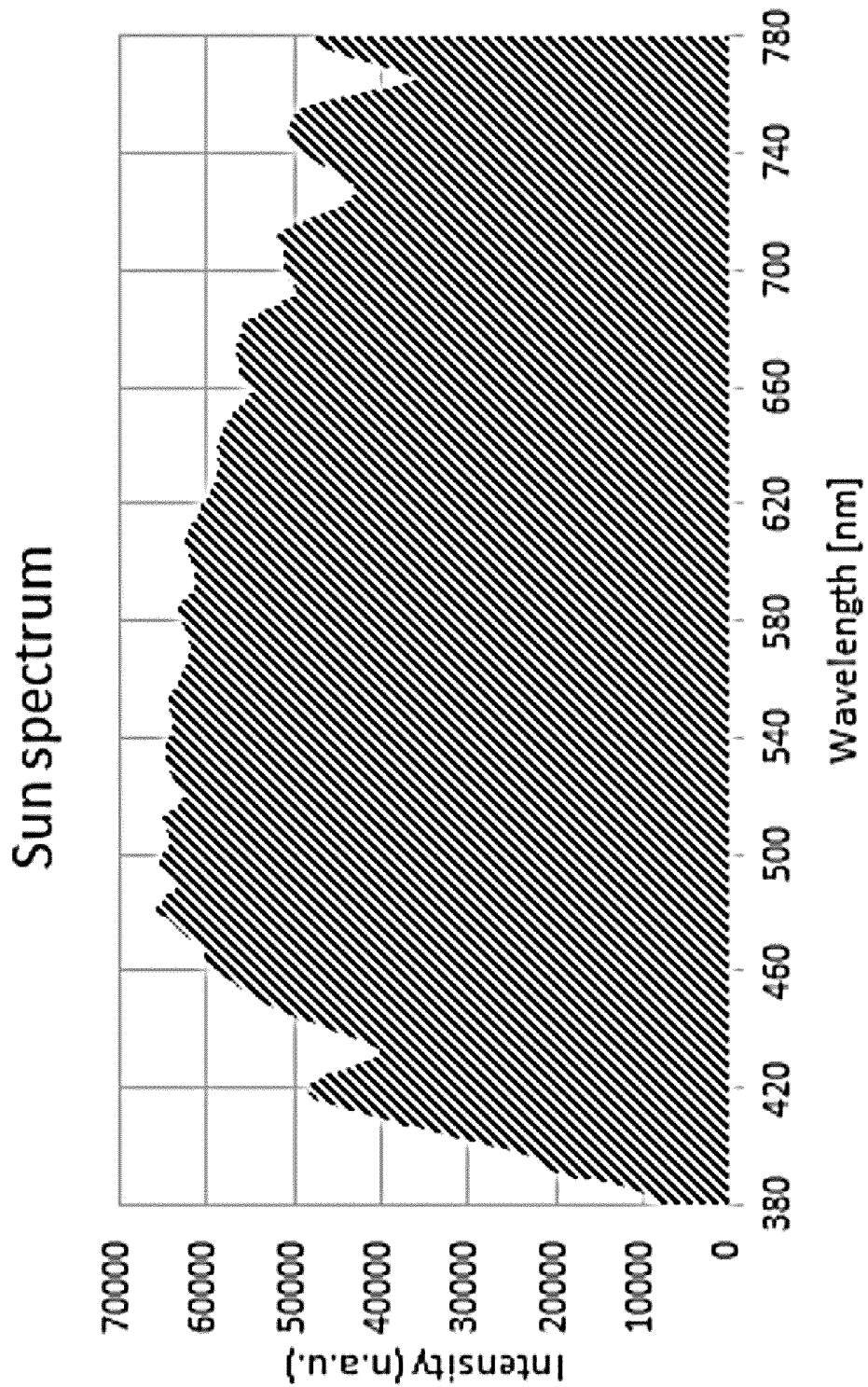

The raw spectrum of sun light in the range of 380-780 nm is shown in FIG. 23 as a hatched area (irradiance of 396.24 W/m$^2$ and CIE 1931 color coordinates: x=0.3437, y=0.3590). As can be seen in this figure, the power in the IR regime is more significant as compared to LED and NEON light.

Figure 24:
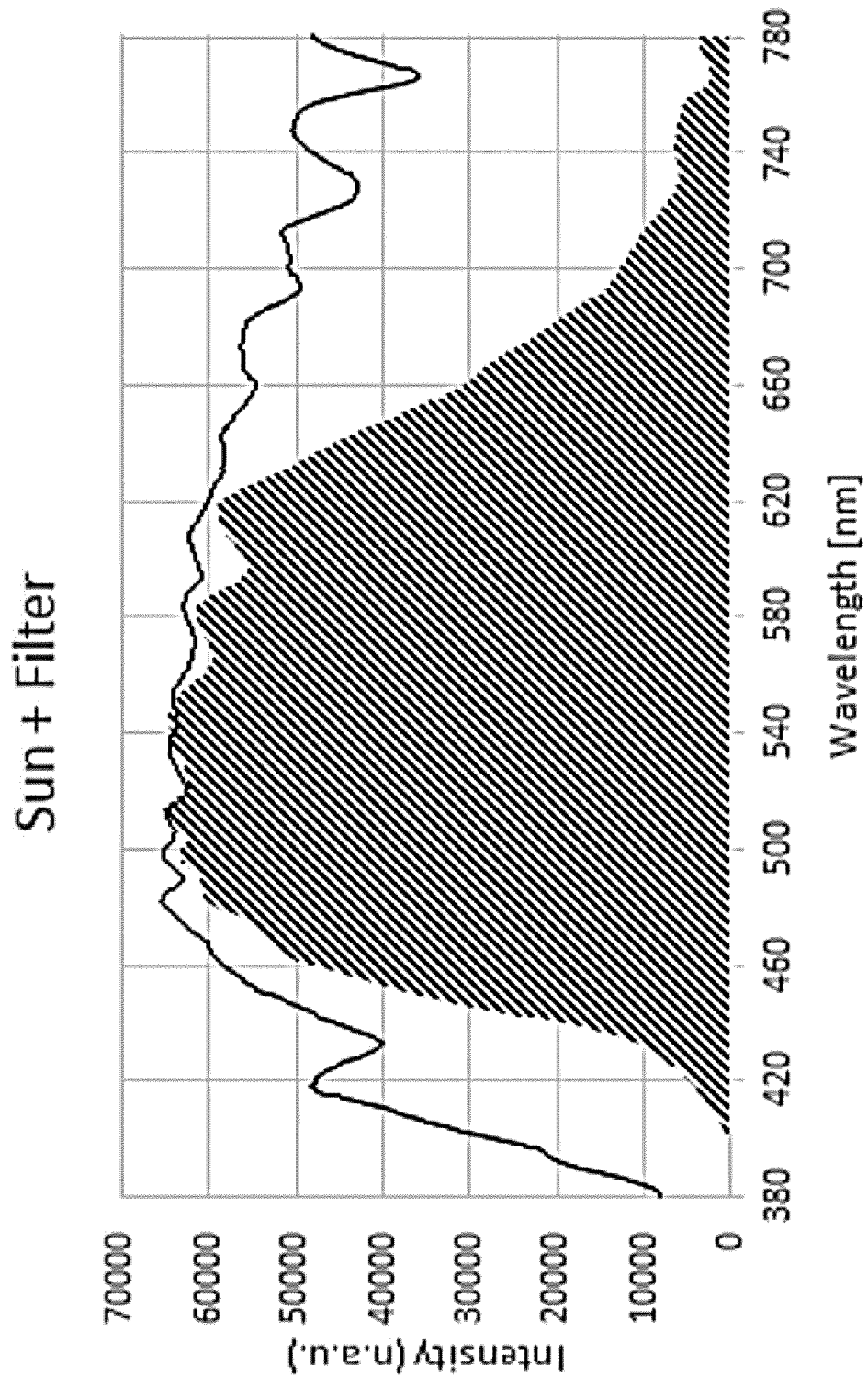

In FIG. 24 both the raw sun light spectrum (indicated by the solid black line) and the sun light spectrum filtered by an optical filter according to the present disclosure (indicated by the hatched area) are shown in the wavelength range of 380-780 nm (irradiance of 153.61 W/m$^2$, CIE 1931 color coordinates: x=0.3192, y=0.3934). As can be seen from these spectra, both the high-energetic and the low-energetic spectral components are suppressed by an optical filter according to the present disclosure. In this way, the sun light spectrum is adjusted to the spectral sensitivity characteristics of the human eye (match of about 97%).

In the table shown in FIG. 25, the results of various measurements with different light sources (LED, Neon) and different carrier materials (PMMA, CR39) are summarized.

In detail, in the lines of the table shown in FIG. 25 the characteristics of different light spectra are shown. These characteristics include: the illuminance $E_v$(lux=lm/m$^2$), the color temperature $T_{cp}$ (K=Kelvin), the dominant wavelength $\lambda_d$ (nm), the color coordinates in the CIE 1931 color space, the excitation effect or probability Pe (%) at the dominant wavelength $\lambda_d$, and the irradiance SDE (W/m$^2$) in different wavelength ranges. "C60 (@)" further indicates that the carrier includes $C_{60}$ molecules dispersed therein. "C60 (nf)" indicates that the carrier has a $C_{60}$ layer deposited thereon.

In line A0 of the table shown in FIG. 25 the characteristics of light emitted by an LED are summarized.

In line A01, the characteristics of the LED light after passage through a PMMA substrate that does not include nano-photonic material are summarized.

In line A011, the characteristics of the LED light after passage through an optical filter according to the present disclosure including a PMMA carrier with $C_{60}$ molecules incorporated therein are summarized.

In line A02, the characteristics of the LED light after passage through a CR39 substrate that does not include nano-photonic material are summarized.

In line A021, the characteristics of the LED light after passage through an optical filter according to the present disclosure including a CR39 carrier with a $C_{60}$ film provided thereon are summarized.

In line B0 of the table shown in FIG. 25 the characteristics of Neon light are summarized.

In line B01, the characteristics of the Neon light after passage through a PMMA substrate that is free of nano-photonic material are summarized.

In line B011, the characteristics of the Neon light after passage through an optical filter according to the present disclosure including a PMMA carrier with $C_{60}$ molecules incorporated therein are summarized.

In line B02, the characteristics of the Neon light after passage through a CR39 substrate that is free of nano-photonic material are summarized.

In line B021, the characteristics of the Neon light after passage through an optical filter according to the present disclosure including a CR39 carrier with a $C_{60}$ film provided thereon are summarized.

In the following, several Examples according to the present disclosure will be described.

Example 1 is an optical filter comprising a layer structure comprising a plurality of layers stacked in a thickness direction of the layer structure and including: a plurality of nano-photonic layers formed of a nano-photonic material with icosahedral or dodecahedral symmetry, and at least one substrate layer formed of an optically transparent material, wherein one of the at least one substrate layer is positioned between two of the plurality nano-photonic layers in the thickness direction of the layer structure.

In Example 2, the subject matter of Example 1 can optionally further include that the nano-photonic material comprises fullerene molecules.

In Example 3, the subject matter of Example 2 can optionally further include that the nano-photonic material comprises $C_{60}$ fullerene molecules.

In Example 4, the subject matter of any one of Examples 1 to 3 can optionally further include that the at least one substrate has a thickness in a range selected from: 5-30 nm, 5-20 nm, 5-15 nm, and 5-10 nm.

In Example 5, the optical filter of any one of Examples 1 to 4 can optionally further include that at least one of the plurality of nano-photonic layers has a thickness in a range selected from: 3-10 nm, 3-7 nm, and 3-5 nm.

In Example 6, the subject matter of any one of Examples 1 to 5 can optionally further include that the at least one substrate layer is free of nano-photonic material.

In Example 7, the subject matter of any one of Examples 1 to 6 can optionally further include that at least one of the plurality of nano-photonic layers is free of optically transparent material, e.g. of optically transparent material of the type included in the at least one substrate layer. Optionally, a plurality of the nano-photonic layers or even all nano-photonic layers may be free of the optically transparent material of the at least one substrate layer.

In Example 8, the subject matter of any one of Examples 1 to 7 can optionally further include that the layer structure includes a plurality of substrate layers.

In Example 9, the subject matter of Example 8 can optionally further include that the plurality of substrate layers and the plurality of nano-photonic layers are alternately arranged in the thickness direction of the layer structure.

In Example 10, the subject matter of Example 8 or 9 can optionally further include that at least two of the plurality of substrate layers have mutually different refractive indices.

In Example 11, the subject matter of any one of Examples 8 to 10 can optionally further include that at least two of the plurality of substrate layers have mutually different dimensions in the thickness direction of the layer structure.

In Example 12, the subject matter of any one of Examples 1 to 11 can optionally further comprise a carrier supporting the layer structure.

In Example 13, the subject matter of Example 12 can optionally further include that the carrier is made of an optically transparent material and is configured as a carrier layer stacked on the layer structure.

In Example 14, the subject matter of Example 13 can optionally further include that the carrier is configured as a lens.

In Example 15, the subject matter of Example 13 or 14 can optionally further include that the carrier includes nano-photonic material with icosahedral or dodecahedral symmetry.

According to an Example 16, spectacles comprising an optical filter of any one of Examples 1 to 15 are provided.

Example 17 is a therapeutic lamp, comprising a light source and an optical filter of any one of Examples 1 to 15.

In Example 18, the therapeutic lamp of Example 17 can optionally further include a polarizer positioned on a light path between the light source and the optical filter and configured to polarize light emitted by the light source.

In Example 19, the therapeutic lamp of Example 18 can optionally further include that the polarizer is configured as a linear polarizer configured to convert incident light into linearly polarized light.

In Example 20, the subject matter of Example 19 can optionally further include that the polarizer comprises or is configured as a Brewster polarizer.

Example 21 is a lighting means including an optical filter that includes nano-photonic material with icosahedral or dodecahedral symmetry, in particular an optical filter of any one of Examples 1 to 15. These lighting means may include room lighting means such as light bulbs or neon tubes, and street lighting means.

Example 22 is a display including an optical filter that includes nano-photonic material with icosahedral or dodecahedral symmetry, in particular an optical filter of any one of Examples 1 to 15. The display may be the display of a computer, a TV, a mobile phone etc.

Example 23 is a display protective foil configured as or including an optical filter that includes nano-photonic material with icosahedral or dodecahedral symmetry, in particular an optical filter of any one of Examples 1 to 15.

Example 24 is a window including an optical filter that includes nano-photonic material with icosahedral or dodecahedral symmetry, in particular an optical filter of any one of Examples 1 to 15. The window may be configured as a window of a building, a vehicle, an aircraft, a watercraft etc.

Example 25 is a toy including an optical filter that includes nano-photonic material with icosahedral or dodecahedral symmetry, in particular an optical filter of any one of Examples 1 to 15. The toy may be configured as a gaming computer.

Example 26 is an optical lens including an optical filter that includes nano-photonic material with icosahedral or dodecahedral symmetry, in particular an optical filter of any one of Examples 1 to 15. The optical lens may be configured as a spectacle lens.

Example 27 defines the use of an optical filter of any one of Examples 1 to 15 for filtering light.

In Example 28, the subject matter of Example 27 can optionally further include that the light is sun light or artificial light.

The invention claimed is:

1. An optical filter based on light-matter coupling in quantum confined cavity spaces comprising a layer structure comprising a plurality of layers stacked in a thickness direction of the layer structure and including:
a plurality of nano-photonic layers formed of a nano-photonic material with icosahedral or dodecahedral symmetry, and at least one substrate layer formed of an optically transparent material, the at least one substrate layer being free of nano-photonic material, wherein one of the at least one substrate layer is positioned between two of the plurality of nano-photonic layers in the thickness direction of the layer structure such that a 2D cavity is defined by the layer structure, wherein the 2D cavity is defined by the layer structure satisfying the condition:

$$\frac{\lambda}{2\pi l} > 1,$$

wherein $\lambda$ is a wavelength of visible incident light and $l$ is a thickness of the at least one substrate layer.

2. The optical filter of claim 1, wherein the nano-photonic material comprises fullerene molecules.

3. The optical filter of claim 2, wherein the nano-photonic material comprises $C_{60}$ fullerene molecules.

4. The optical filter of claim 1, wherein the at least one substrate layer has a thickness in a range from 5-30 nm.

5. The optical filter of claim 1, wherein at least one of the plurality of nano-photonic layers has a thickness in a range from 3-10 nm.

6. The optical filter of claim 1, wherein at least one of the plurality of nano-photonic layers is free of the optically transparent material of the at least one substrate layer.

7. The optical filter of claim 1, wherein the layer structure includes a plurality of substrate layers.

8. The optical filter of claim 7, wherein the plurality of substrate layers and the plurality of nano-photonic layers are alternately arranged in the thickness direction of the layer structure.

9. The optical filter of claim 7, wherein at least two of the plurality of substrate layers have mutually different refractive indices.

10. The optical filter of claim 7, wherein at least two of the plurality of substrate layers have mutually different dimensions in the thickness direction of the layer structure.

11. The optical filter of claim 1, further comprising a carrier supporting the layer structure.

12. The optical filter of claim 11, wherein the carrier is made of an optically transparent material and is configured as a carrier layer stacked on the layer structure.

13. The optical filter of claim 12, wherein the carrier is configured as a lens.

14. The optical filter of claim 12, wherein the carrier includes nano-photonic material.

15. Spectacles comprising an optical filter of claim 1.

16. A therapeutic lamp, comprising a light source and an optical filter of claim 1.

17. The therapeutic lamp of claim 16, further comprising a polarizer positioned on a light path between the light source and the optical filter and configured to polarize light emitted by the light source.

18. The therapeutic lamp of claim 17, wherein the polarizer is configured as a linear polarizer configured to convert incident light into linearly polarized light.

19. The therapeutic lamp of claim 18, wherein the polarizer comprises or is configured as a Brewster polarizer.

20. A lighting means including an optical filter of claim 1.

21. A display including an optical filter of claim 1.

22. A display protective foil configured as or including an optical filter of claim 1.

23. A window including an optical filter of claim 1.

24. A toy including an optical filter of claim 1.

25. An optical lens including an optical filter of claim 1.

* * * * *